United States Patent
Berkoh et al.

(10) Patent No.: US 8,357,263 B2
(45) Date of Patent: Jan. 22, 2013

(54) APPARATUS AND METHODS FOR ELECTRICAL MEASUREMENTS IN A PLASMA ETCHER

(75) Inventors: Daniel K. Berkoh, Woodland Hills, CA (US); Elena B. Woodard, Fillmore, CA (US); Dean G. Scott, Mesa, AZ (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/898,615

(22) Filed: Oct. 5, 2010

(65) Prior Publication Data

US 2012/0083051 A1  Apr. 5, 2012

(51) Int. Cl.
- *H01J 31/32* (2006.01)
- *H01L 21/306* (2006.01)
- *H01L 21/683* (2006.01)
- *H01L 21/768* (2006.01)

(52) U.S. Cl. .............................. 156/345.13; 156/345.28
(58) Field of Classification Search .................. 438/10; 156/345, 345.1, 345.11, 345.12, 345.13; 118/728, 723
See application file for complete search history.

(56) References Cited

U.S. PATENT DOCUMENTS

| | | | | |
|---|---|---|---|---|
| 4,542,298 A | * | 9/1985 | Holden | 250/443.1 |
| 5,022,956 A | * | 6/1991 | Cziep et al. | 216/18 |
| 5,571,366 A | | 11/1996 | Ishii et al. | |
| 6,494,958 B1 | * | 12/2002 | Shamouilian et al. | 118/728 |
| 6,815,352 B1 | | 11/2004 | Tamura et al. | |
| 6,824,627 B2 | * | 11/2004 | Dhindsa et al. | 156/60 |
| 2001/0050147 A1 | | 12/2001 | Nawata et al. | |
| 2005/0151544 A1 | | 7/2005 | Mahoney et al. | |
| 2010/0159120 A1 | * | 6/2010 | Dzengeleski et al. | 427/8 |

FOREIGN PATENT DOCUMENTS

WO  WO 2012/047819  4/2012

OTHER PUBLICATIONS

International Search Report in PCT/US2011/054653 (WO 2012/047819), dated Apr. 20, 2012.
Written Opinion of the International Searching Authority in PCT/US2011/054653 (WO 2012/047819), dated Apr. 20, 2012.

* cited by examiner

*Primary Examiner* — Olik Chaudhur
*Assistant Examiner* — Wilner Jean Baptiste
(74) *Attorney, Agent, or Firm* — Knobbe Martens Olson & Bear LLP

(57) ABSTRACT

Apparatus and methods for plasma etching are disclosed. In one embodiment, an apparatus for etching a plurality of features on a wafer comprises a chamber, a feature plate disposed in the chamber for holding the wafer, a gas channel configured to receive a plasma source gas, an anode disposed above the feature plate, a cathode disposed below the feature plate, a radio frequency power source configured to provide a radio frequency voltage between the anode and the cathode so as to generate plasma ions from the plasma source gas, a pump configured to remove gases and etch particulates from the chamber, and a clamp configured to clamp the wafer against the feature plate. The clamp includes at least one measurement hole for passing a portion of the plasma ions to measure a DC bias of the feature plate.

12 Claims, 24 Drawing Sheets

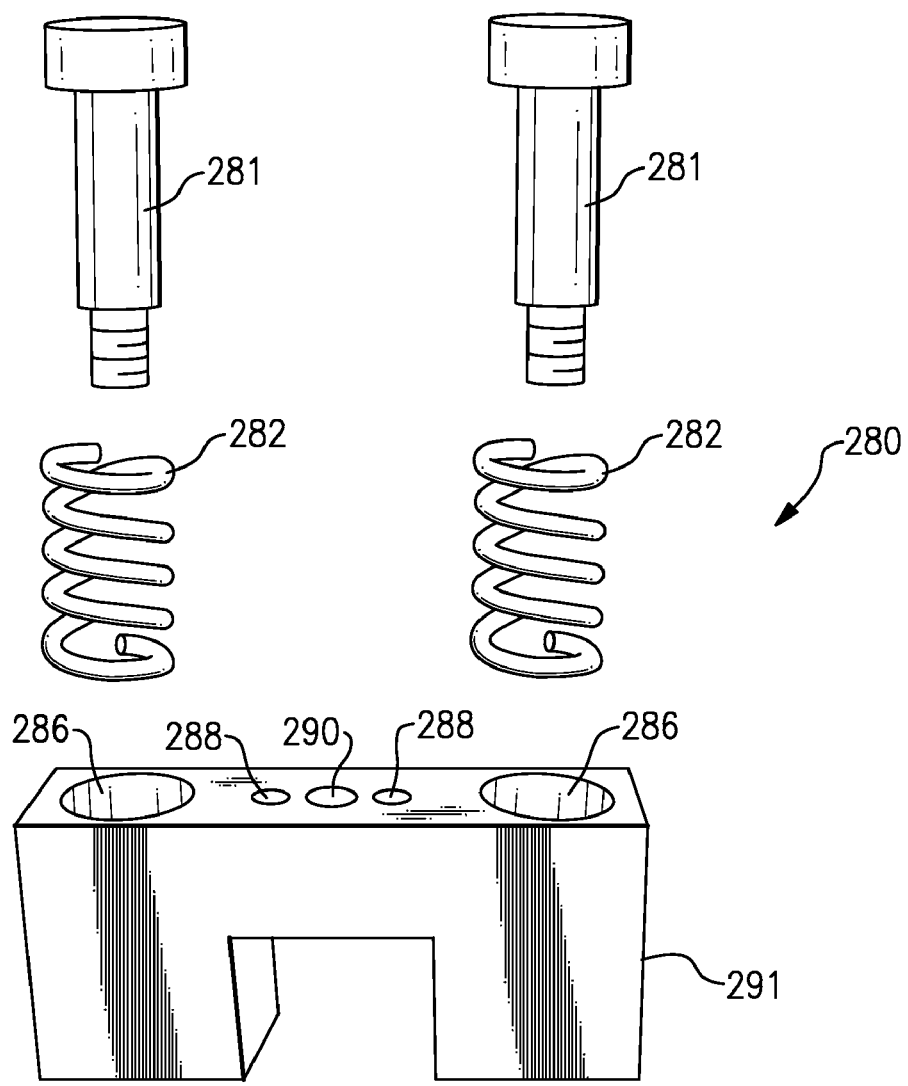
FIG.16A
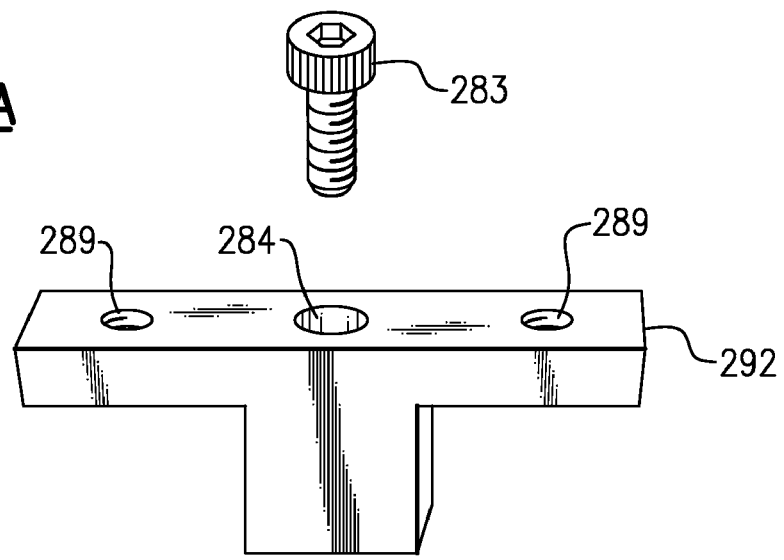

APPARATUS AND METHODS FOR ELECTRICAL MEASUREMENTS IN A PLASMA ETCHER

BACKGROUND

1. Field

Embodiments of the invention relate to semiconductor processing and, in particular, to plasma etching.

2. Description of the Related Art

Plasma etching processes can be used to form vias and other structures on a substrate. For example, a plasma etching process can be used for etching wafers in heterojunction bipolar transistor (HBT) or bipolar field effect transistor (BiFET) GaAs processes.

The processing time of a wafer in a plasma etcher can be important for throughput of a fabrication facility. Thus, it can be desirable to complete a plasma etching process in a relatively short time. Furthermore, it can be desirable to reduce the frequency of maintenance and repair of a plasma etcher, in order to improve throughput and to reduce costs.

Accordingly, there is a need for improved methods of etching wafer features and for improved plasma etchers.

SUMMARY

In certain embodiments, the present disclosure relates to a method of etching a plurality of features on a wafer. The method includes positioning the wafer within a chamber of a plasma etcher, generating plasma ions using a radio frequency power source and a plasma source gas, directing the plasma ions toward the wafer using an electric field, and focusing the plasma ions using a plasma focusing ring. The plasma focusing ring is configured to increase a flux of plasma ions arriving at a surface of the wafer to control the formation of the plurality of features and structures associated therewith.

In various embodiments, the structures are pillars.

In some embodiments, the plurality of features includes a plurality of vias.

In a number of embodiments, the plurality of features includes a plurality of through-wafer vias.

In accordance with several embodiments, the method further includes removing effluent gases from the chamber at a rate sufficient to prevent etch byproducts from forming pillars in the plurality of the through-wafer vias.

In various embodiments, each through-wafer via has a volume greater than about 100,000 $\mu m^3$.

In several embodiments, each through-wafer via has a depth greater than about 90 $\mu m$.

In accordance with a number of embodiments, the wafer is a GaAs wafer.

In various embodiments, the wafer has a diameter greater than or equal to about 150 mm.

According to several embodiments, the wafer has a thickness less than about 200 $\mu m$.

In some embodiments, the wafer is bonded to a carrier substrate.

In certain embodiments, the carrier substrate is a sapphire substrate.

In a number of embodiments, the plasma source gas includes chlorine.

In accordance with various embodiments, the plasma focusing ring has an inner diameter in the range of about 5 inches to about 12 inches.

In several embodiments, the method further includes positioning the focusing ring at a distance ranging between about 1 inches to about 4 inches from the wafer.

In some embodiments, the plasma focusing ring includes a ceramic.

In certain embodiments, the present disclosure relates to an apparatus for etching a plurality of features on a wafer. The apparatus includes a chamber, a holder disposed in the chamber configured to hold the wafer, a gas channel configured to receive a plasma source gas, a radio frequency power source configured to generate plasma ions from the plasma source gas, a pump configured to remove gases and etch particulates from the chamber, and a focusing ring configured to focus plasma ions toward the holder, thereby increasing the density of plasma ions delivered to the wafer to control the formation of the plurality of features and structures associated therewith.

In various embodiments, the structures are pillars.

In some embodiments, the plurality of features includes a plurality of vias.

In a number of embodiments, the plurality of features includes a plurality of through-wafer vias.

According to some embodiments, the holder is configured to hold a wafer bonded to a carrier substrate, the carrier substrate having a diameter greater than a diameter of the wafer.

In certain embodiments, the holder is configured to hold a wafer having a diameter greater than or equal to about 150 mm.

In various embodiments, the plasma focusing ring has an inner diameter in the range of about 5 inches to about 12 inches.

In several embodiments, the plasma focusing ring is positioned from holder by a distance ranging between about 1 inches to about 4 inches.

In accordance with a number of embodiments, the plasma focusing ring includes a ceramic.

In various embodiments, the apparatus further includes a clamp for holding the wafer against the holder.

In some embodiments, the apparatus further includes a spring clamp assembly and a rod, the spring clamp assembly having a first end connected to the clamp and a second end connected to a first end of the rod.

In a number of embodiments, the apparatus further includes an anode positioned above the holder and a cathode positioned beneath the holder, the anode and the cathode electrically connected to the radio frequency power source.

In several embodiments, the apparatus further includes an electrode shield surrounding the cathode.

In some embodiments, the electrode shield includes a rod hole configured to receive a second end of the rod.

According to various embodiments, the spring clamp assembly includes an upper body and a lower body, the upper body includes an assembly hole for receiving both a spring and a screw for attaching the upper body to the lower body.

In accordance with some embodiments, the upper body further includes a mounting hole for receiving a screw for attaching the upper body to the clamp.

In a number of embodiments, the lower body includes a hole for receiving a screw for attaching the lower body to the first end of the rod.

In certain embodiments, the present disclosure relates to a method of etching a plurality of features on a wafer. The method includes positioning a wafer on a feature plate within a chamber of a plasma etcher, providing a plasma source gas within the chamber, providing an anode above the feature plate and a cathode below the feature plate, connecting a portion of the cathode to the feature plate, generating plasma ions using a radio frequency power source and the plasma source gas, directing the plasma ions toward the wafer using an electric field, and providing an electrode shield around the cathode, the electrode shield configured to protect the cathode from ions directed toward the cathode including the portion of the cathode connected to the feature plate.

In various embodiments, the method further includes providing a plasma focusing ring within the chamber.

In some embodiments, the plurality of features includes a plurality of vias.

In a number of embodiments, the plurality of features includes a plurality of through-wafer vias.

In accordance with several embodiments, the method further includes removing effluent gases from the chamber at a rate sufficient to prevent etch byproducts from forming structures within the plurality of the through-wafer vias.

In certain embodiments, the structures are pillars.

In various embodiments, each through-wafer via has a volume greater than about 100,000 $\mu m^3$.

According to some embodiments, each through-wafer via has a depth greater than about 90 $\mu m$.

In several embodiments, the wafer is a GaAs wafer.

In certain embodiments, the wafer is a GaAs wafer having a diameter greater than or equal to about 150 mm.

In accordance with a number of embodiments, the wafer is a GaAs wafer bonded to a carrier substrate.

In some embodiments, the carrier substrate is a sapphire substrate.

In a number of embodiments, the plasma source gas includes chlorine.

In various embodiments, the electrode shield has an inner diameter in the range of about 8.2 inches to about 8.5 inches.

According to several embodiments, the electrode shield has an outer diameter in the range of about 9 inches to about 10 inches.

In some embodiments, an inner circumference of the electrode shield is spaced from an outer circumference of the cathode by a distance of at least about 0.1 inches.

In accordance with certain embodiments, the electrode shield includes aluminum.

In some embodiments, the electrode shield includes at least one mounting hole for mounting the electrode shield to the plasma etcher.

In a number of embodiments, the method further includes providing a clamp for holding the wafer against the feature plate.

In certain embodiments, the present disclosure relates to an apparatus for etching a plurality of features on a wafer. The apparatus includes a chamber, a feature plate disposed in the chamber for holding the wafer, a gas channel configured to receive a plasma source gas, an anode disposed above the feature plate, a cathode disposed below the feature plate, the cathode including a portion connected to the feature plate, a radio frequency power source configured to provide a radio frequency voltage between the anode and the cathode so as to generate plasma ions from the plasma source gas, a pump for removing gases and etch particulates from the chamber, and an electrode shield configured to protect the cathode from ions directed toward the cathode including the portion connected to the feature plate.

In various embodiments, the plurality of features includes a plurality of vias.

In some embodiments, the plurality of features includes a plurality of through-wafer vias.

In a number of embodiments, the feature plate is configured to hold a wafer bonded to a carrier substrate, the carrier substrate having a diameter greater than a diameter of the wafer.

In accordance with several embodiments, the feature plate is configured to hold a wafer having a diameter at least about 150 mm.

According to some embodiments, the apparatus further includes a plasma focusing ring positioned between the feature plate and the anode.

In various embodiments, the electrode shield has an inner diameter in the range of about 8.2 inches to about 8.5 inches.

In several embodiments, the electrode shield has an outer diameter in the range of about 9 inches to about 10 inches.

In certain embodiments, an inner circumference of the electrode shield is spaced from an outer circumference of the cathode by a distance of at least about 0.1 inches.

In accordance with a number of embodiments, the electrode shield includes aluminum.

In various embodiments, the electrode shield includes at least one mounting hole for mounting the electrode shield to the plasma etcher.

According to several embodiments, the apparatus further includes a clamp for holding the wafer against the feature plate.

In some embodiments, the apparatus further includes a spring clamp assembly and a rod, the spring clamp assembly having a first end connected to the clamp and a second end connected to a first end of the rod.

In several embodiments, the electrode shield includes a rod hole configured to receive a second end of the rod.

In a number of embodiments, the spring clamp assembly includes an upper body and a lower body, the upper body including an assembly hole for receiving a spring and a screw for attaching the upper body to the lower body.

In some embodiments, the upper body further includes a mounting hole for receiving a screw for attaching the upper body to the clamp.

In a number of embodiments, the lower body includes a hole for receiving a screw for attaching the lower body to the first end of the rod.

In certain embodiments, the present disclosure relates to an apparatus for etching a plurality of features on a wafer. The apparatus includes a chamber, a feature plate disposed in the chamber for holding the wafer, an anode and a cathode within the chamber, a radio frequency power source configured to provide a radio frequency voltage between the anode and the cathode, a clamp for holding the wafer against the feature plate, a rod, and a spring clamp assembly having a first end connected to the clamp and a second end connected to a first end of the rod, and an electrode shield surrounding at least a portion of the cathode, the electrode shield including a hole receiving a second end of the rod.

In a number of embodiments, the spring clamp assembly includes an upper body and a lower body.

In various embodiments, the upper body includes an assembly hole for receiving both a spring and a screw for attaching the upper body to the lower body.

In several embodiments, the upper body includes a mounting hole for receiving a screw for attaching the upper body to the clamp.

In a number of embodiments, the lower body includes a hole for receiving a screw for attaching the lower body to the first end of the rod.

In certain embodiments, the present disclosure relates to a method of etching a plurality of features on a wafer. The method includes positioning a wafer on a feature plate within a chamber of a plasma etcher, clamping the wafer against the feature plate using a clamp, the clamp including at least one measurement hole, providing a plasma source gas within the chamber, providing an anode above the clamp and a cathode below the clamp and the feature plate, generating plasma ions using a radio frequency power source and the plasma source gas, directing the plasma ions toward the wafer using an electric field, passing a portion of the plasma ions through the at least one measurement hole, and measuring an electrical characteristic using the portion of the plasma ions passing through the at least one measurement hole.

In various embodiments, the method further includes providing an electrode shield around the cathode, the electrode shield configured to protect the cathode from ions directed toward the cathode.

In some embodiments, the electrode shield includes at least one rod hole for connecting a rod between the electrode shield and the clamp.

In accordance with several embodiments, the method further includes providing a plasma focusing ring within the chamber.

In various embodiments, the plurality of features includes a plurality of vias.

In several embodiments, the plurality of features includes a plurality of through-wafer vias.

In certain embodiments, the method further includes removing effluent gases from the chamber at a rate sufficient to prevent etch byproducts from depositing on the wafer and forming structures within the plurality of the through-wafer vias.

In a number of embodiments, the structures are pillars.

In various embodiments, each through-wafer via has a volume greater than about 100,000 $\mu m^3$.

In certain embodiments, each through-wafer via has a depth greater than about 90 $\mu m$.

In various embodiments, the wafer is a GaAs wafer.

According to several embodiments, the wafer is a GaAs wafer having a diameter at least about 150 mm.

In some embodiments, the wafer is a GaAs wafer bonded to a carrier substrate.

In several embodiments, the carrier substrate is a sapphire substrate.

In a number of embodiments, the plasma source gas includes chlorine.

In some embodiments, the at least one measurement hole has a diameter ranging between about 0.2 inches to about 0.7 inches.

In certain embodiments, the at least one measurement hole includes 2 to 6 measurement holes.

In a number of embodiments, measuring an electrical characteristic includes measuring a DC bias.

According to certain embodiments, the method further includes adjusting a power provided to the radio frequency power source based at least in part on the measured DC bias.

In a number of embodiments, the clamp includes a ceramic.

In several embodiments, the clamp is configured to mate with the feature plate.

According to various embodiments, the feature plate includes aluminum.

In some embodiments, the feature plate has a thickness in the range of about 0.2 inches to about 0.5 inches.

In certain embodiments, the present disclosure relates to an apparatus for etching a plurality of features on a wafer. The apparatus includes a chamber, a feature plate disposed in the chamber for holding the wafer, a gas channel configured to receive a plasma source gas, an anode disposed above the feature plate, a cathode disposed below the feature plate, a radio frequency power source configured to provide a radio frequency voltage between the anode and the cathode so as to generate plasma ions from the plasma source gas, a pump configured to remove gases and etch particulates from the chamber, and a clamp configured to clamp the wafer against the feature plate, the clamp including at least one measurement hole for passing a portion of the plasma ions to measure a DC bias of the feature plate.

In various embodiments, the plurality of features includes a plurality of vias.

In accordance with several embodiments, the plurality of features includes a plurality of through-wafer vias.

In certain embodiments, the feature plate is configured to hold a wafer bonded to a carrier substrate, the carrier substrate having a diameter greater than that of the wafer.

In several embodiments, the feature plate is configured to hold a wafer having a diameter of at least about 150 mm.

In accordance with a number of embodiments, the apparatus further includes a plasma focusing ring positioned between the clamp and the anode.

In some embodiments, the apparatus further includes a spring clamp assembly and a rod, the spring clamp assembly having a first end connected to the clamp and a second end connected to a first end of the rod.

In a number of embodiments, the apparatus further includes an electrode shield surrounding the cathode configured to protect the cathode from ions directed toward the cathode.

In various embodiments, the electrode shield includes a hole configured to receive a second end of the rod.

According to several embodiments, the spring clamp assembly includes an upper body and a lower body, the upper body including an assembly hole for receiving both a spring and a screw for attaching the upper body to the lower body.

In a number of embodiments, the upper body further includes a mounting hole for receiving a screw for attaching the upper body to the clamp.

In certain embodiments, the lower body includes a hole for receiving a screw for attaching the lower body to the first end of the rod.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/898,576, titled "APPARATUS AND METHODS FOR FOCUSING PLASMA," and U.S. patent application Ser. No. 12/898,579, titled "APPARATUS AND METHODS FOR SHIELDING A PLASMA ETCHER ELECTRODE," each filed on even date herewith and each hereby incorporated by reference herein in its entirety.

BRIEF DESCRIPTION OF THE DRAWINGS

FIG. 16A is an exploded perspective view of a clamp spring assembly in accordance with one embodiment.

DETAILED DESCRIPTION OF CERTAIN EMBODIMENTS

The headings provided herein, if any, are for convenience only and do not necessarily affect the scope or meaning of the claimed invention.

Figure 1:
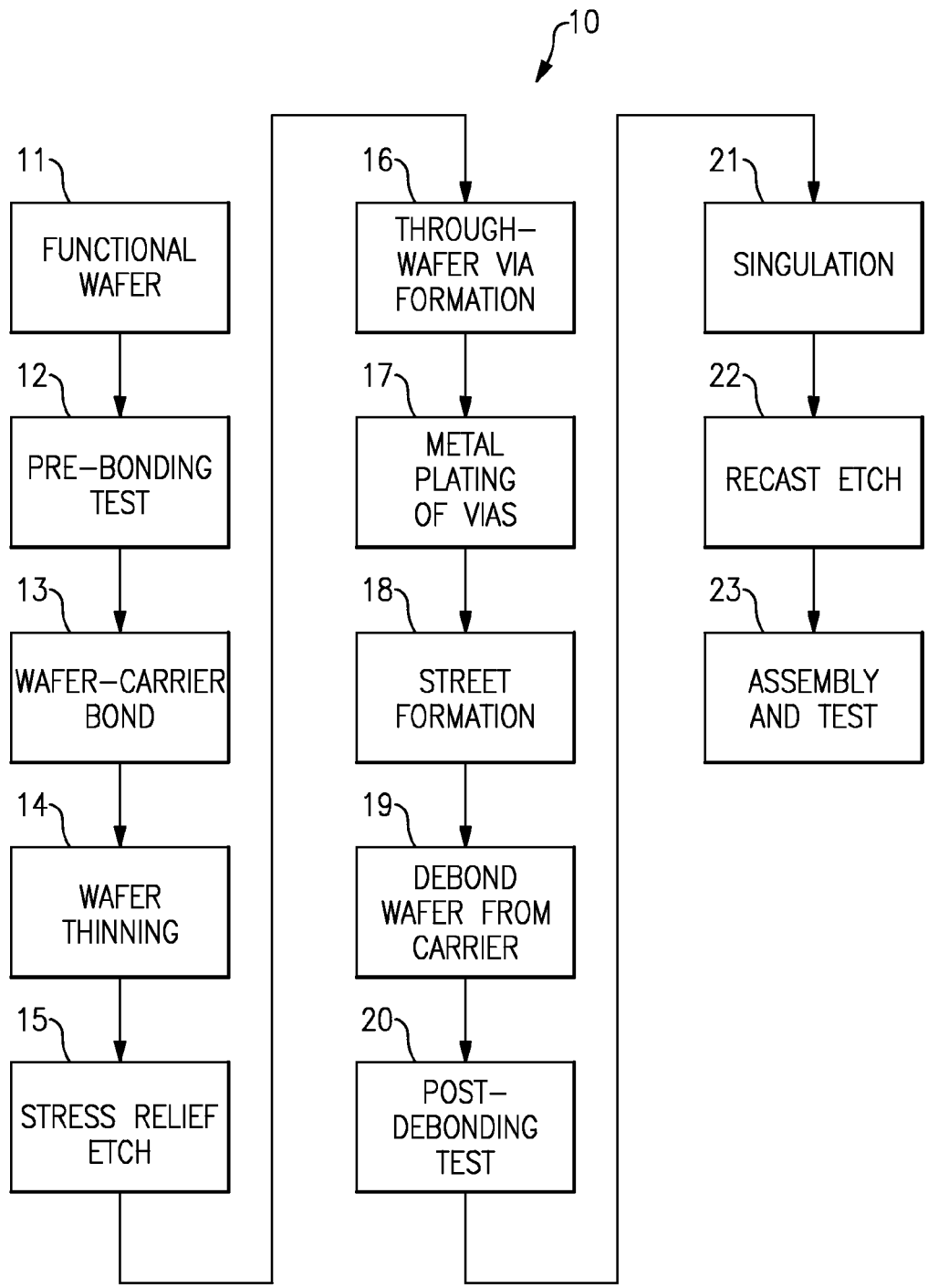
FIG. 1 shows an example sequence of wafer processing for forming through-wafer features such as vias.

Provided herein are various methodologies and devices for processing wafers such as semiconductor wafers. FIG. 1 shows an example of a process 10 where a functional wafer is further processed to form through-wafer features such as vias and back-side metal layers. As further shown in FIG. 1, the example process 10 can include bonding of a wafer to a carrier for support and/or to facilitate handling during the various steps of the process, and debonding of the wafer from the carrier upon completion of such steps. FIG. 1 further shows that such a wafer separated from the carrier can be further processed so as to yield a number of dies.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
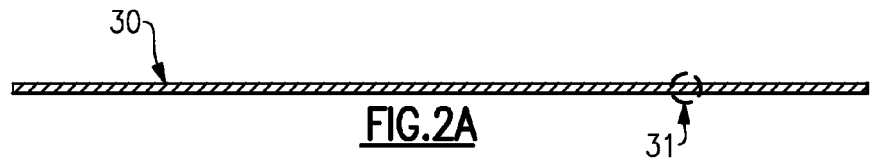
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
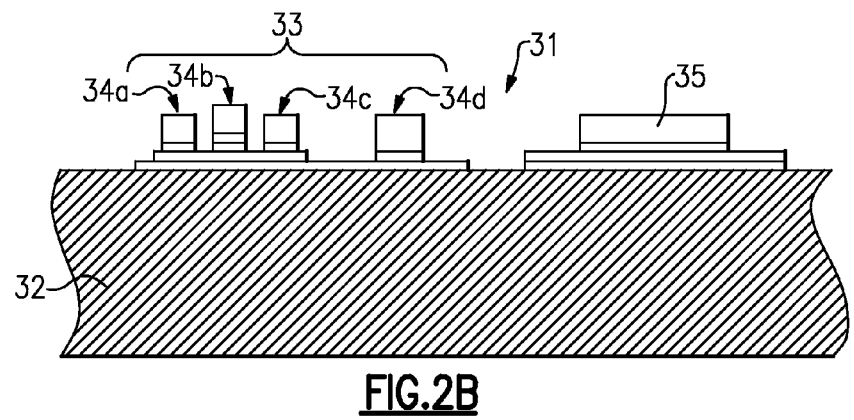

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34$b$, bases 34$a$, 34$c$, and a collector 34$d$. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
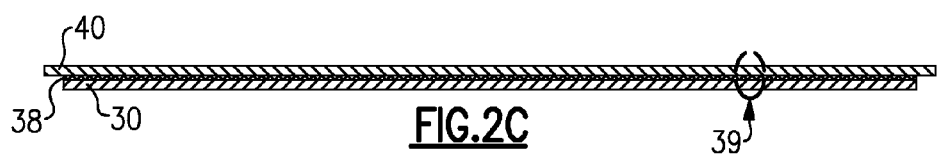

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding block 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections)

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate diameter range | Carrier plate thickness range | Wafer size |
| --- | --- | --- |
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
| --- | --- | --- |
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
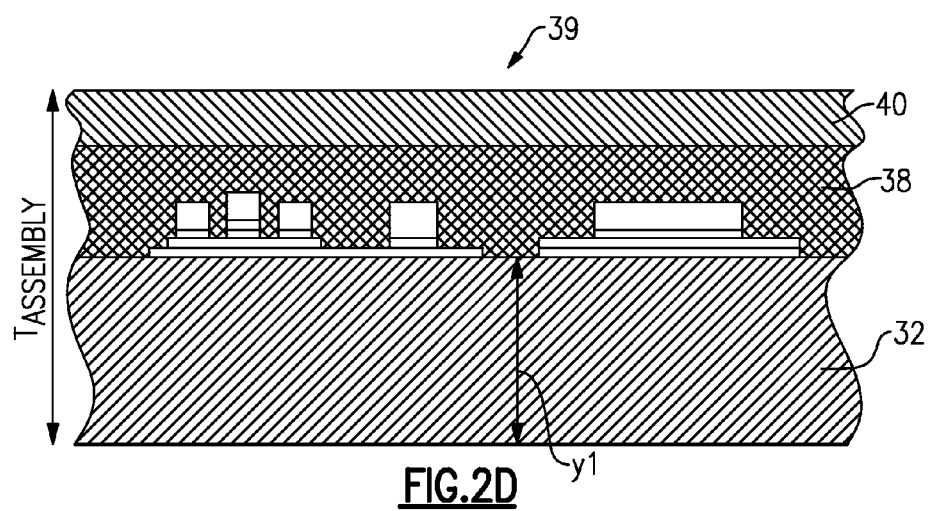

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of y1, and the carrier plate 40 has a generally fixed thickness (e.g., one of the thicknesses in Table 1). Thus, the overall thickness ($T_{assembly}$) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
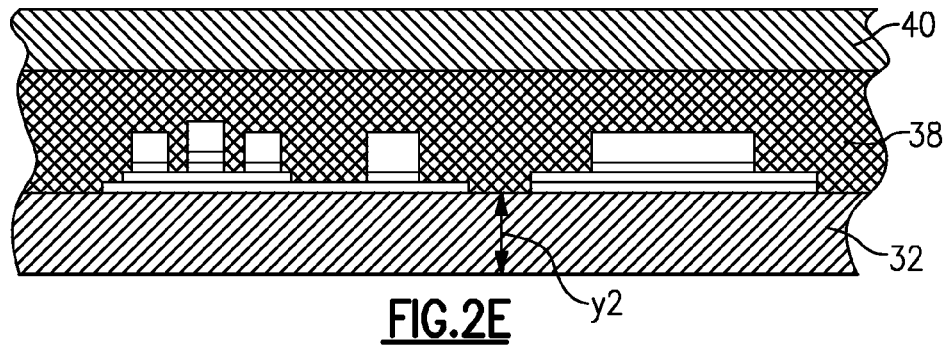

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via a two-step grind with coarse and fine diamond-embedded grinding wheels) so as to yield an intermediate thickness-substrate (with thickness y2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an $O_2$ plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O_2$ and/or $H_2O$. Such an etching process can provide relief from possible stress on the wafer due to the rough ground surface.

Figure 2F:
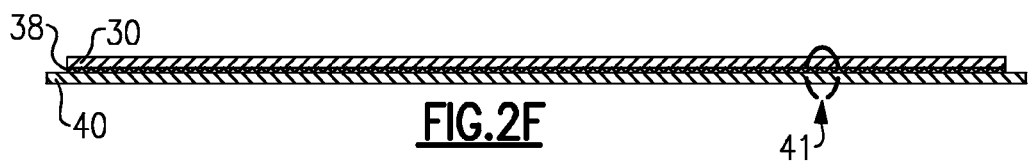
Figure 2G:
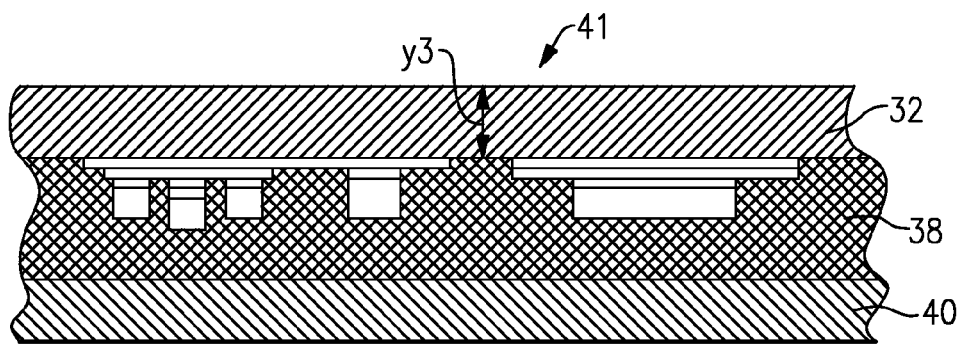

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of y3.

By way of an example, the pre-grinding thickness (y1 in FIG. 2D) of a 150 mm (also referred to as "6-inch") GaAs substrate can be approximately 675 µm. The thickness y2 (FIG. 2E) resulting from the grinding process can be in a range of approximately 102 µm to 120 µm. The ash and etching processes can remove approximately 2 µm to 20 µm of the rough surface so as to yield a thickness of approximately 100 µm. (y3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
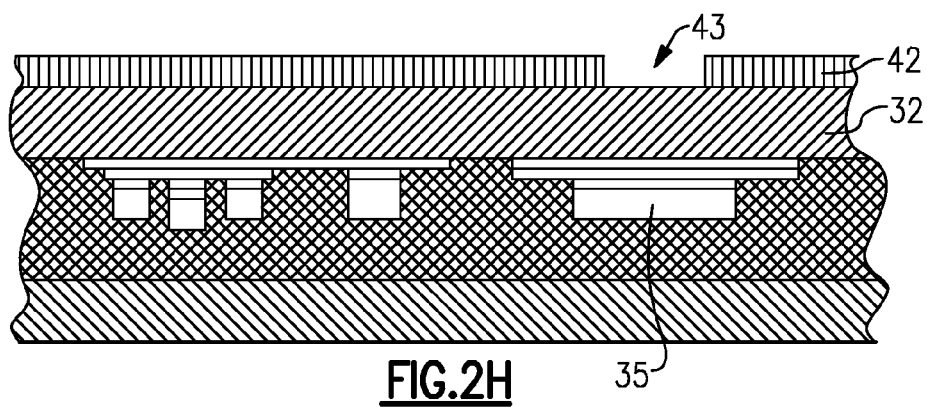
Figure 2I:
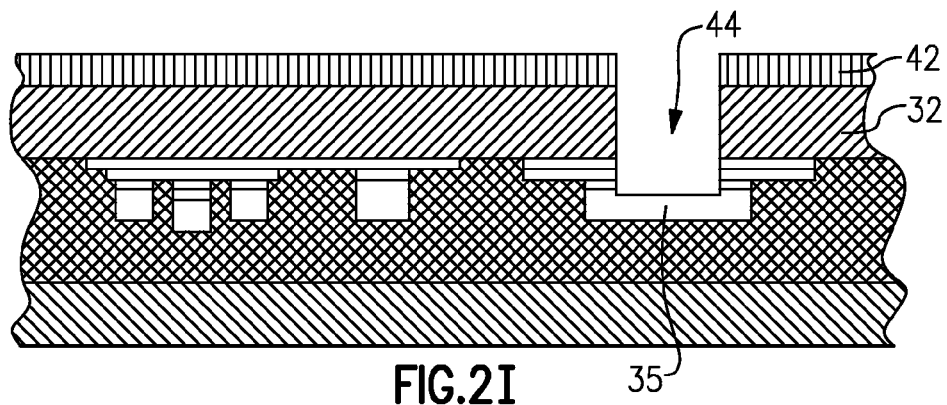
Figure 2J:
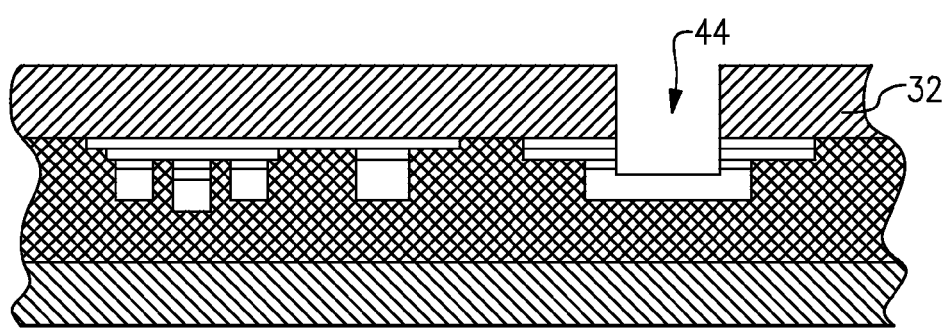

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side. Additional details of the block 16 can be as described below with reference to FIGS. 3-15.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness in a range of about 15 µm to 20 µm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. In various implementations, a desired shaped via can be an important design parameter for facilitating proper metal coverage therein in subsequent processes. Additional details of plasma etching can be as described below with reference to FIGS. 3-15.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
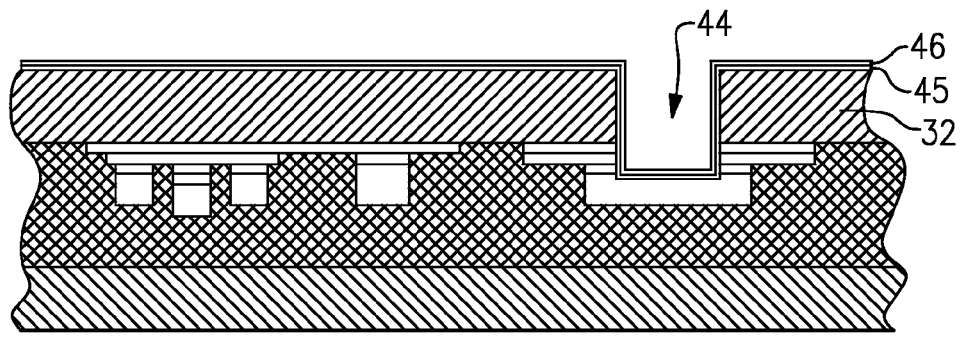
Figure 2L:
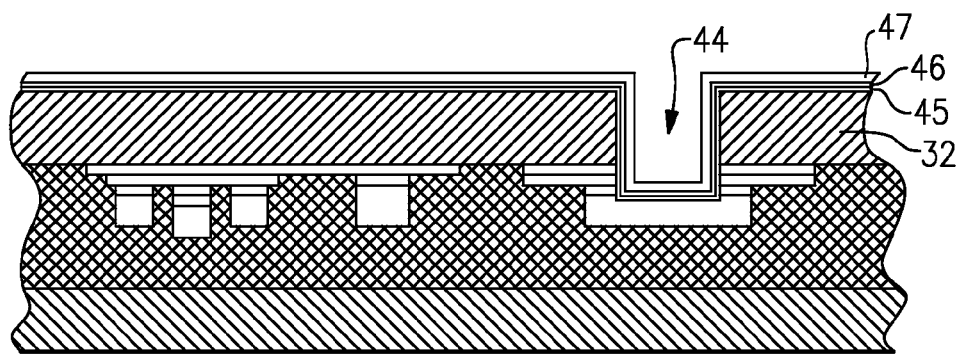

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 such as a thick gold layer shown in FIG. 2L. In certain implementations, the thick gold layer can be formed by a plating technique.

In certain implementations, the gold plating process can be performed after a pre-plating cleaning process (e.g., $O_2$ plasma ash and HCl cleaning). The plating can be performed to form a gold layer of about 3 μm to 6 μm to facilitate the foregoing electrical connectivity and heat transfer functionalities. The plated surface can undergo a post-plating cleaning process (e.g., $O_2$ plasma ash).

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
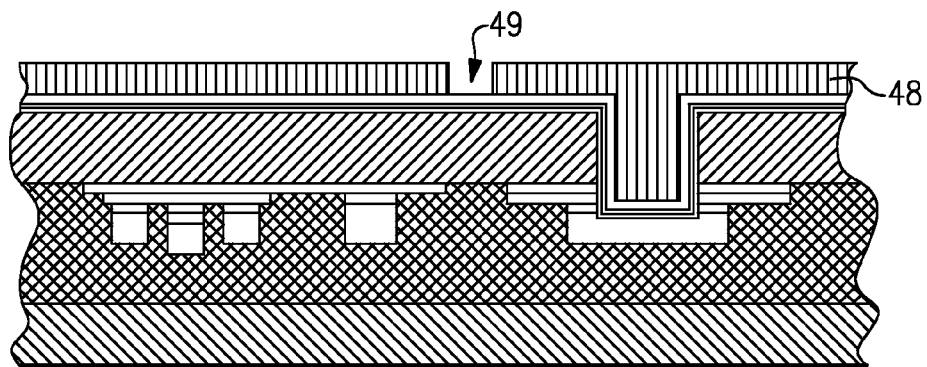
Figure 2N:
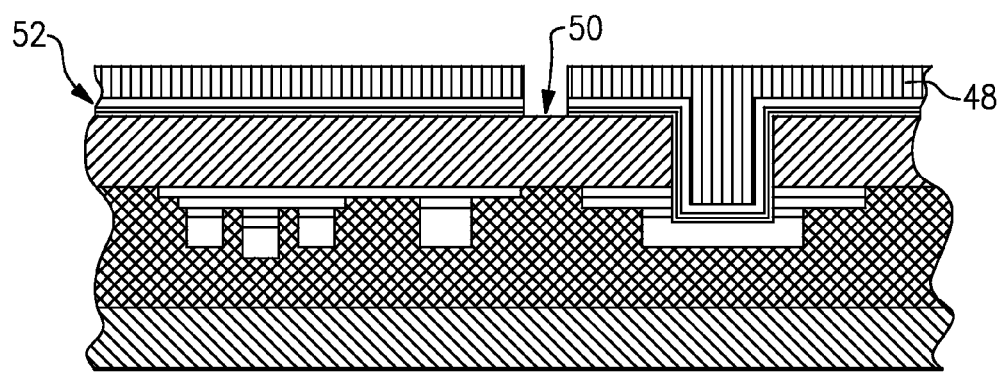
Figure 2O:
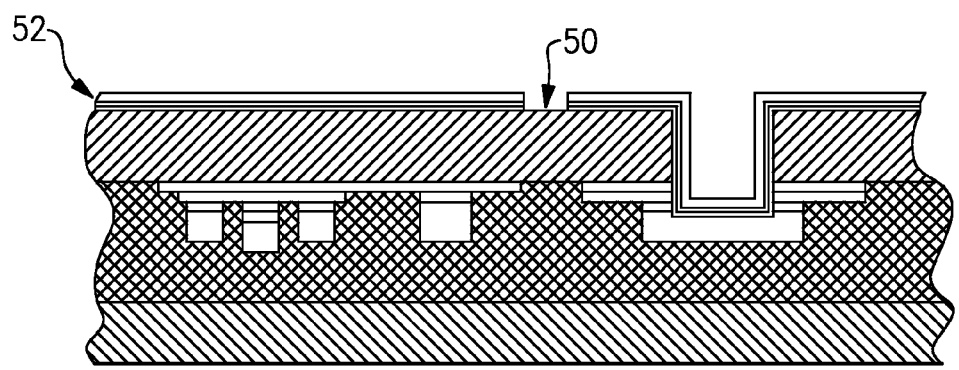

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., $O_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., $O_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
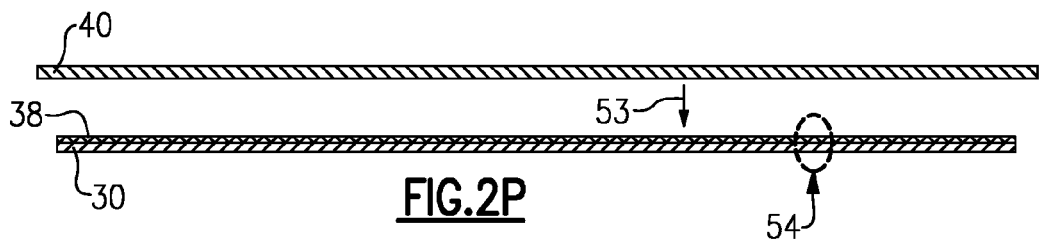

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature to a range of about 130° C. to 170° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
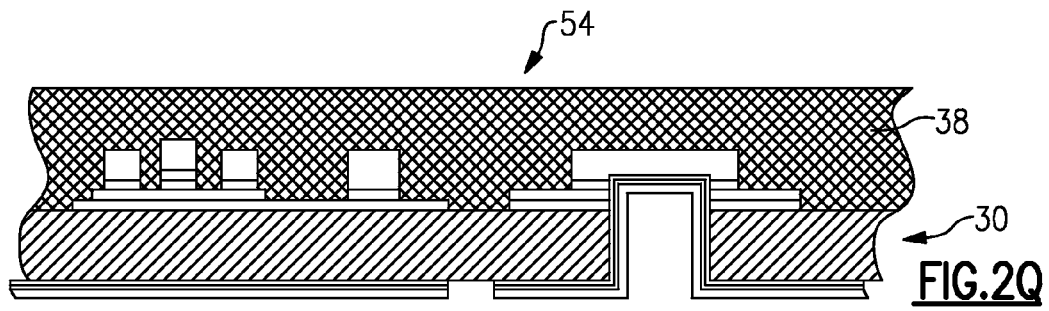

In FIGS. 2P and 2Q, the adhesive layer 38 is depicted as remaining with the wafer 30 instead of the carrier plate 40. It will be understood that some adhesive may remain with the carrier plate 40.

Figure 2R:
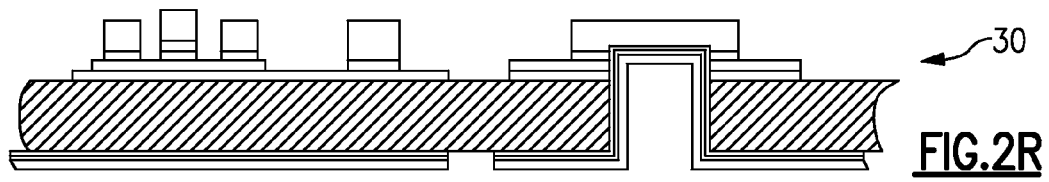

FIG. 2R shows the adhesive 38 removed from the front side of the wafer 30. The adhesive can be removed by a cleaning solution (e.g., acetone), and remaining residues can be further removed by, for example, a plasma ash (e.g., $O_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
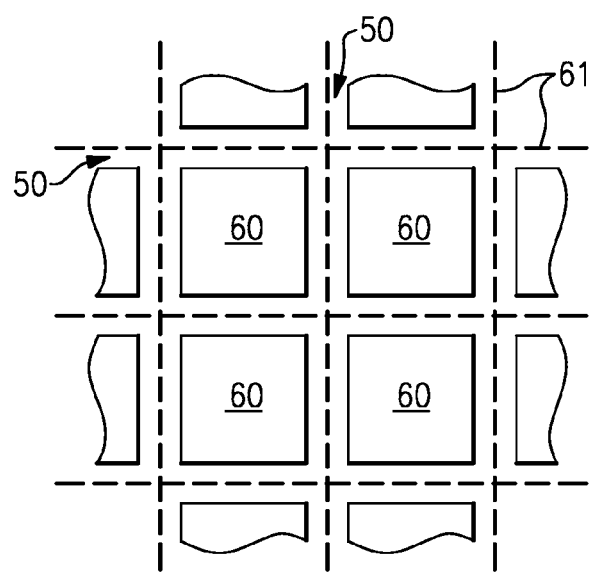

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
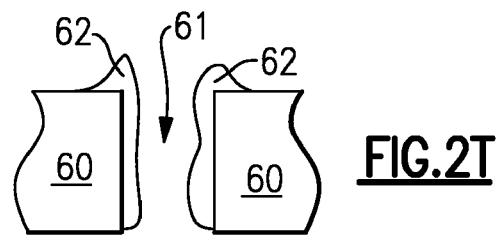

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
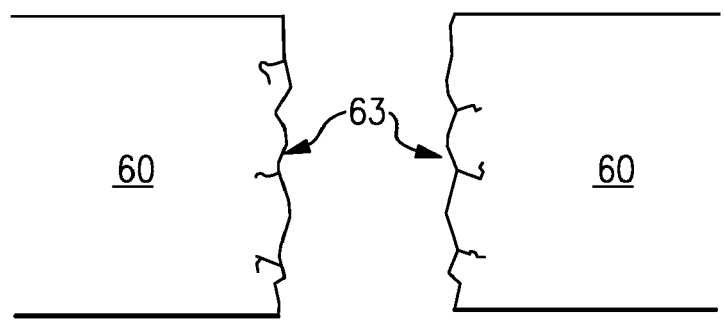
Figure 2V:
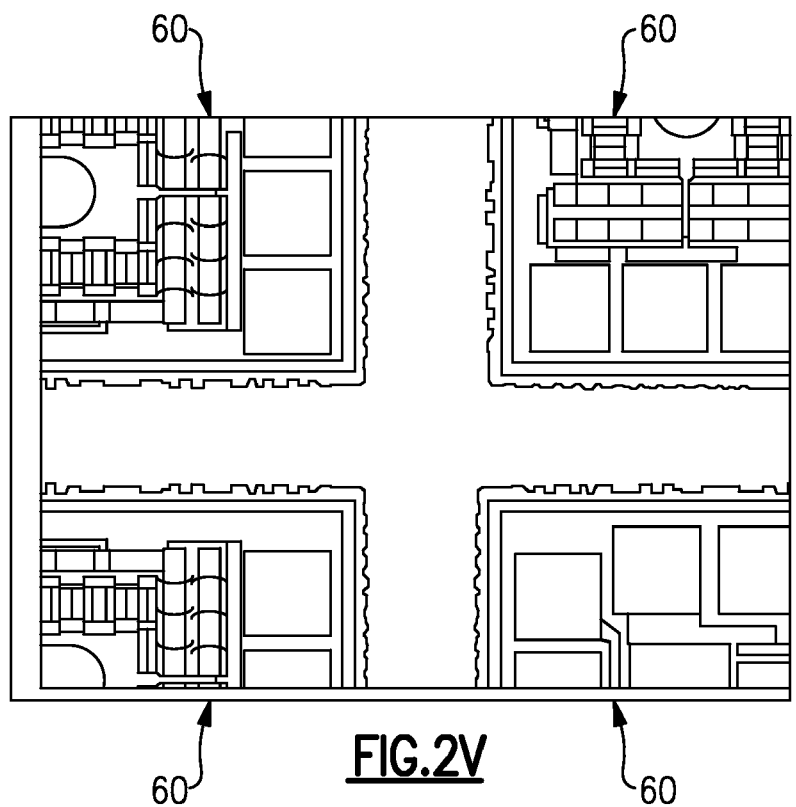

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

With advances in technology, wafers having increased diameter may be used in semiconductor manufacturing processes, such as the processes described above in reference to FIGS. 1 and 2. For example, 6-inch wafers may be processed instead of 4-inch wafers. The same manufacturing facility used to process previous wafers may be converted to process larger wafers, as manufacturing facilities are very expensive to build and time consuming to set up for production. Part of the conversion to modify a manufacturing facility for production of larger wafers may include modifying a plasma etcher to accommodate a larger wafer size. By modifying existing tools, substantial costs associated with new equipment and modification of the manufacturing facility may be avoided or reduced.

Overview of Plasma Etching Systems

Figure 3:
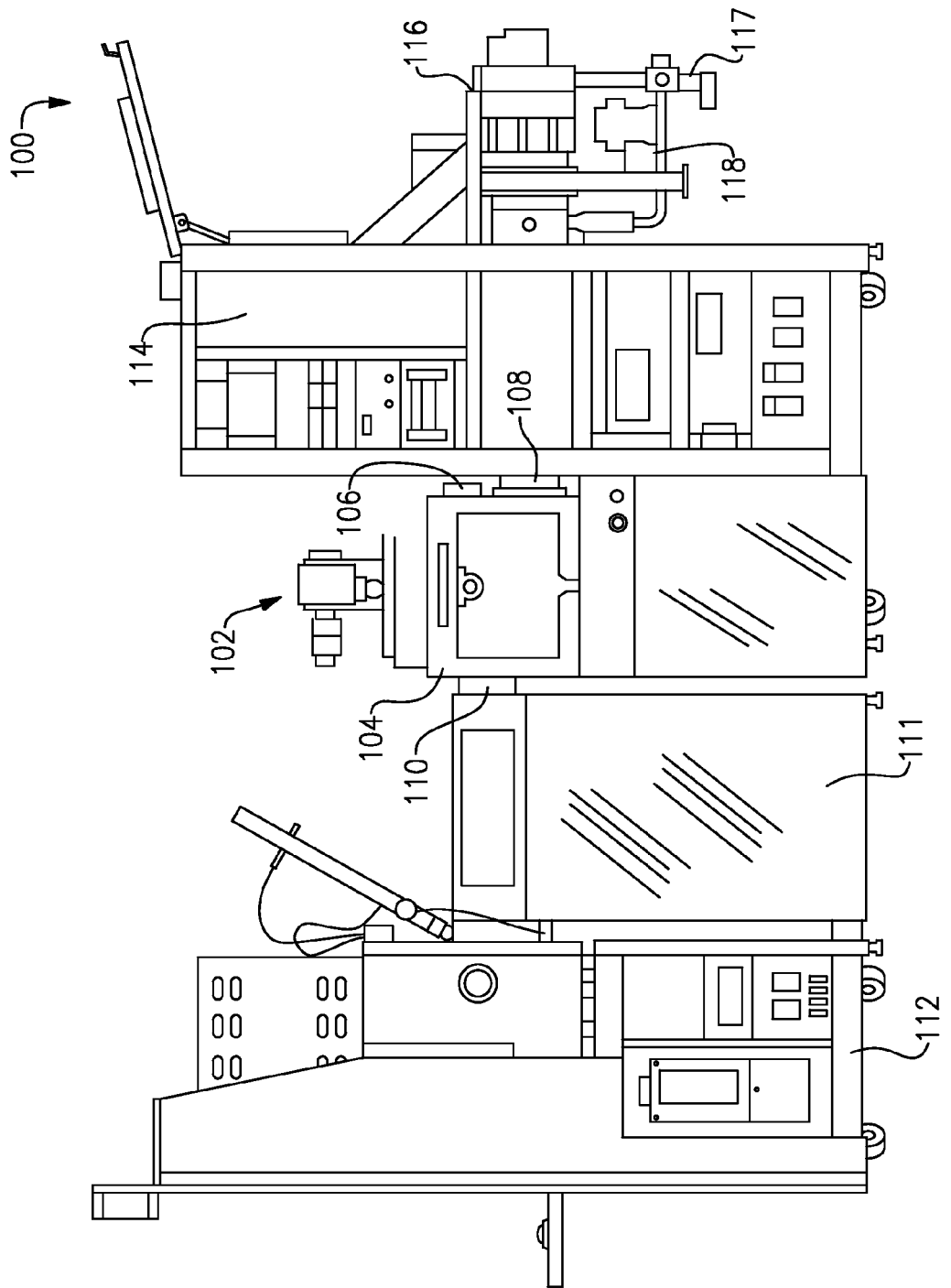
FIG. 3 is a schematic illustration of one example of an etching system for use with a plasma etcher.

FIG. 3 is a schematic illustration of one example of an etching system 100 for use with a plasma etcher. The illustrated etching system 100 includes a plasma etcher 102, a transfer module 111, a load module 112, a gas source module 114, a molecular pump 116, a byproduct exhaust line 117, and a pressure channel 118. As illustrated, the plasma etcher 102 includes an external housing 104, a gas source channel 106, an exhaust channel 108, and a loading channel 110. The etching system 100 can be used in the through-wafer via formation process (block 16) of the process 10 of FIG. 1.

The load module 112 can be used for loading wafers into the etching system 100. For example, an operator can insert one or more wafers into a first end of the load module 112 for processing. Once loaded into the load module 112, the wafers can be transferred using a robot into the transfer module 111, which can be pressure controlled. The wafers can be loaded from the transfer module 111 into the plasma etcher 102 through the loading channel 110 using robotics. After processing, the wafers can be removed from the load module 112 in a similar manner. Although the load module 112 is illustrated as servicing a single plasma etcher 102, in certain embodiments, the load module 112 can be connected to a plurality of plasma etchers and transfer modules.

The plasma etcher 102 can be employed to form features using a variety of semiconductor processes. For example, the plasma etcher 102 can be used in HBT GaAs or BiFET GaAs processes to form through-wafer vias or other features.

The housing 104 can aid in creating a sealed chamber for processing samples. The samples can be, for example, GaAs wafers having a diameter at least about 6 inches. A plasma gas source can be supplied to the interior chamber of the plasma etcher 102 using the gas source channel 106 and the gas source module 114. The exhaust channel 108 can be connected to one or more pumps and can be used to remove gases from within the plasma etcher 102. For example, the molecular pump 116 can be configured to remove byproducts using the exhaust channel 117, and pressure control can be achieved using the pressure channel 118.

The plasma etcher 102 can receive a plasma source gas from the gas source channel 106. The plasma source gas can include, for example, a gas containing chlorine such as $Cl_2$ and/or $BCl_3$. A wafer can be positioned on a cathode within the plasma etcher 102, and the cathode can have a controlled voltage potential and function as a first electrode. An anode or second electrode can be provided within the plasma etcher 102, and the plasma source gas can be stimulated by a radio frequency power source applied between the first and second electrodes.

The radio frequency power source can ionize a portion of the plasma source to form plasma containing electrons and positive ions. The electrons can respond to the varying electric fields produced by the RF driving voltage, which can lead to the creation of sheath region near the electrodes having a net positive charge when averaged over the period of the RF driving voltage. The creation of the positive charged sheath region can create an electric field from the plasma to the wafer. Thus, the ions can be accelerated by an electric field toward the wafer. The ions can bombard the substrate, and can enhance chemical processes occurring at the surface of the wafer. Employing plasma can aid in processing wafers at relatively low temperatures compared to a process using only chemical methods.

The plasma etcher 102 can process samples at a relatively low pressure, such as a pressure of less than about 1 Torr. Processing wafers at a relatively low pressure can aid in delivering activation energy to a surface of a wafer using ions, while minimizing the heat delivered to the wafer.

The exhaust channel 108 can aid in removing gases from the interior of the plasma etcher 102. For example, one or more pumps can be connected to the exhaust channel 108, and the exhaust channel 108 can be used as a channel for removing both particulates resulting from the etch process, as well as plasma source gases. In certain processing systems, the exhaust channel 108 can be connected to a pump having a limited pumping capability. For example, the pumping rate of the molecular pump 118 can be limited by the design of the pump, and/or the pump can be connected to an exhaust line 117 having a limited discharge capability.

When forming features having a relatively large aggregate volume, such as relatively large vias and/or trenches, it can be difficult to remove particulates. For example, as described above, the pump rate of the plasma etcher can be limited, which can limit the amount of effluent gasses and particulates that can be removed from the plasma etcher 102. Furthermore, the features being etched can be relatively large, and it can be difficult to remove particulates from the bottom of certain features. Failure to remove particulates at a sufficient rate can lead to numerous problems, including the formation of structures within the features, such as pillars, as will be described in detail below with reference to FIGS. 5A-5B. Failure to properly etch a wafer can lead to problems including unreliable, and even inoperable, dies. This may result in a corresponding reduction in yield.

Figure 4A:
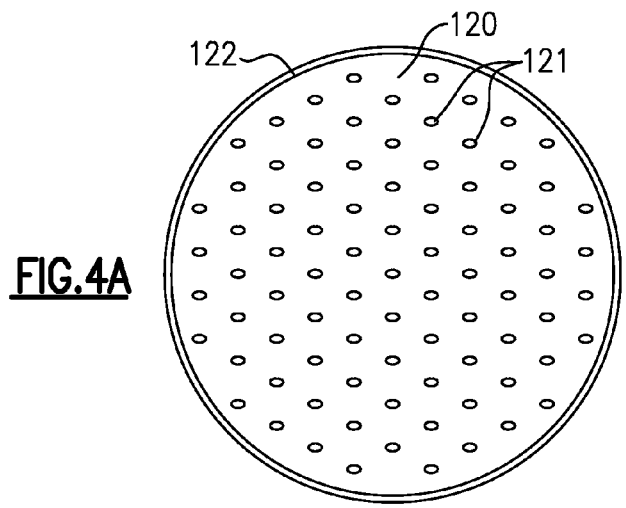
FIG. 4A is a schematic plan view of one example of an etched wafer.

FIG. 4A is a schematic plan view of one example of an etched wafer 120. The wafer 120 includes features 121 formed by a plasma etcher, such as the plasma etcher 102 of FIG. 3. The wafer 120 can be, for example, a GaAs wafer. The wafer 120 can be thinned to a relatively small thickness, such as a thickness less than about 200 µm. In certain embodiments, the wafer 120 can be bonded to a carrier plate or substrate 122, such as a sapphire substrate, to aid in processing the wafer 120 for etching. For example, the carrier substrate 122 can provide structural support to a thinned wafer, thereby helping to prevent breakage or other damage to the wafer 120.

The features 121 can be, for example, vias, trenches or other formations. For example, as will be described below with reference to FIGS. 4B-4C, the features 121 can include through-wafer vias. In order to form the features 121 using the plasma etcher 102, a relatively large volume of material may be needed to be removed from the wafer 120 in a relatively short time.

Figure 4B:
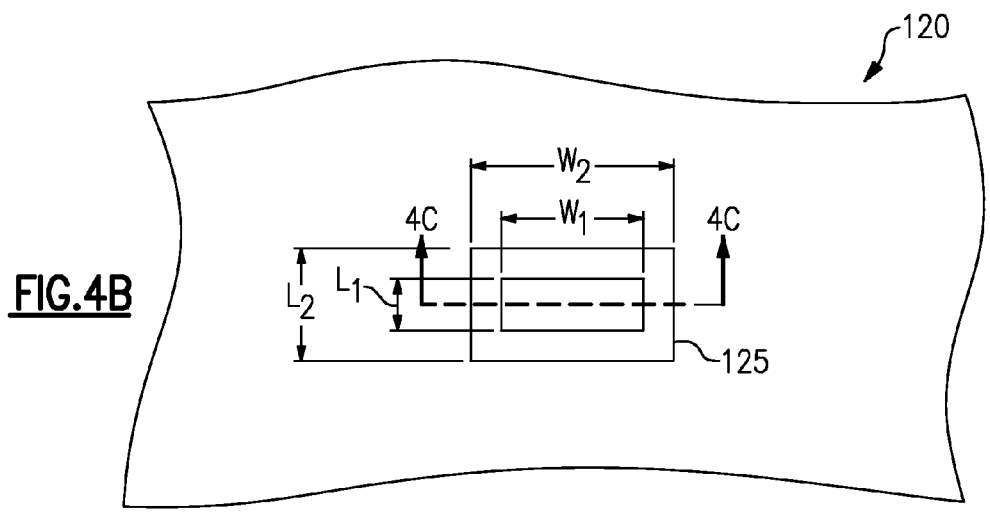
FIG. 4B is a top plan view of a portion of the wafer of FIG. 4A.
Figure 4C:
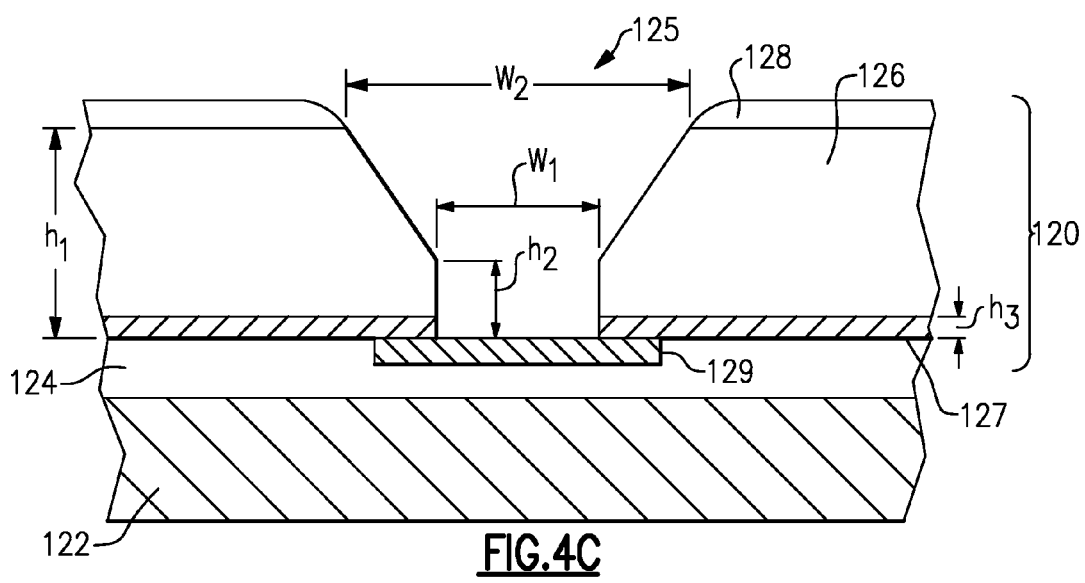
FIG. 4C is a cross section of the wafer of FIG. 4B taken along the line 4C-4C.

FIG. 4B is a partial magnified plan view of a portion of the wafer 120 of FIG. 4A. FIG. 4C is a partial cross section of the wafer 120 of FIG. 4B taken along the line 4C-4C. The wafer 120 includes a substrate 126, an epitaxial layer 127, and a conductive layer 129. An adhesive 124 has been provided on a first major surface of the wafer 120, and has been used to bond a carrier substrate 122 to the wafer 120. The adhesive can be, for example, any suitable polymer or wax. A photoresist layer 128 has been formed on a second surface of the wafer 120, and has been used as a mask for etching a through-wafer via 125 from the second major surface of the wafer 120 to the conductive layer 129.

The wafer 120 can be, for example, a GaAs wafer having a diameter greater than at least about 6 inches and a (100) crystal orientation. The wafer 120 can have a variety of thicknesses, including, for example, a thickness ranging between about 80 µm to about 120 µm, for example, about 200 µm. As shown in FIG. 4C, the wafer 120 can be bonded using the adhesive 124 to the carrier substrate 122, which can be, for example, a sapphire substrate having a diameter larger than that of the wafer 120. However, in certain embodiments, the carrier substrate 122 and the adhesive 124 need not be included.

The epitaxial layer 127 is formed on a first surface of the wafer 120, and can include, for example, a sub-collector layer, a collector layer, a base layer and/or an emitter layer to aid in forming HBT transistor structures. The wafer 120 can include additional layers, such as one or more layers configured to form at least a portion of a BiFET device. The epitaxial layer 127 can have, for example, a thickness $h_3$ ranging between about 1.5 µm to about 3.5 µm. Although the wafer 120 is illustrated as including the epitaxial layer 127, in certain embodiments, the epitaxial layer 127 can be omitted.

The wafer 120 includes the conductive layer 129, which can be any suitable conductor, including, for example, gold or copper. A portion of the conductive layer 129 can be positioned on below the through-wafer via 125, so as to permit a subsequently deposited conductive layer to make electrically contact between the first and second surfaces of the wafer 120. In one embodiment, the wafer 120 includes a plurality of transistors formed on the first major surface of the wafer 120 and a conductive ground plane formed on the second major surface of the wafer, and the through-wafer via is used to provide a robust electrical path between the transistors and the conductive ground plane.

The photoresist layer 128 has been provided on the second surface of the wafer 120 to aid in forming the through-wafer via 125. The photoresist layer 128 can be formed using any suitable technique, including depositing photoresist using spin coating and subsequently patterning the photoresist using lithography. The photoresist layer 128 can be removed after formation of the through-wafer via 125. For example, the photoresist layer 128 can be removed using a plasma ashing process employing any suitable reactive species, including oxygen and/or fluorine. The photoresist layer 128 can be used to define additional features, including through-wafer vias and/or other features.

The through-wafer via 125 can define a cavity in the wafer 120 having a first end and a second end, where the area of the first end is less than the area of the second end. For example, the through-wafer via can include a first end in the wafer 120 having a width $W_1$ and a length $L_1$ and a second end having a width $W_2$ and a length $L_2$, where $W_2$ is greater than $W_1$ and $L_2$ is greater than $L_1$. In one embodiment, $W_2$ ranges between about 60 µm to about 120 µm, $L_2$ ranges between about 60 µm to about 120 µm, $W_1$ ranges between about 15 µm to about 50 µm, and $L_1$ ranges between about 20 µm to about 60 µm.

Although FIG. 4B is illustrated for the case of first and second openings having a cross-section that is substantially rectangular in shape, the through-wafer via 125 can have openings of any of a variety of shapes, including for example, oval, circular, or square shapes. Thus, in certain embodiments, the cross-section of the first opening can have an area ranging between about 300 µm² to about 3,000 µm², and cross-section of the second opening can have an area ranging between about 3,600 µm² to about 14,400 µm². The depth or height of the through-wafer via 125 can be relatively large. In one embodiment, the height $h_1$ of the through-wafer via 125 is in the range of about 80 µm to about 120 µm, for example, about 100 µm.

Sidewall etching of the photoresist layer 128 during etching can reduce the anisotropy of the through-wafer via 125, and can result in the through-wafer via 125 having sloped sides. The sloped sides can improve the uniformity of a subsequently deposited layer, such as a copper or gold layer provided over the through-wafer via 125 after removal of the photoresist layer 128. A portion of the through-wafer via 125 can have sides that are substantially perpendicular with respect to the surface of the wafer 120. In one embodiment, the height $h_2$ of the substantially perpendicular sides ranges between about 1 µm to about 25 µm.

In one embodiment, each through-wafer via 125 has a volume ranging between about 100,000 µm³ to about 600,000 µm³, and the total number of through-wafer vias on the wafer is in the range of about 40,000 to about 90,000. The total volume of GaAs material etched per wafer can range between about 4e10 µm³ to about 54e10 µm³.

Forming through-wafer vias can include removal of a relatively large amount of material from the wafer 120. In order to process wafers at a relatively fast rate, the plasma etcher may be operated using a relatively high RF power, a relatively large amount of plasma source gas, and at a relatively high exhaust pump rate. The plasma etcher 102 may not be designed for removing relatively large amounts of byproducts and effluent gases, and thus the plasma etcher may not have the exhaust pump rate sufficient to remove etching residues and gases. The processing time of a wafer in a plasma etcher can be important for throughput of a fabrication facility. Thus, it may not be feasible to extend etch processing time.

Although a particular embodiment of the wafer was described above, the teachings described herein are applicable to a wide range of wafers and etched features.

Figure 5A:
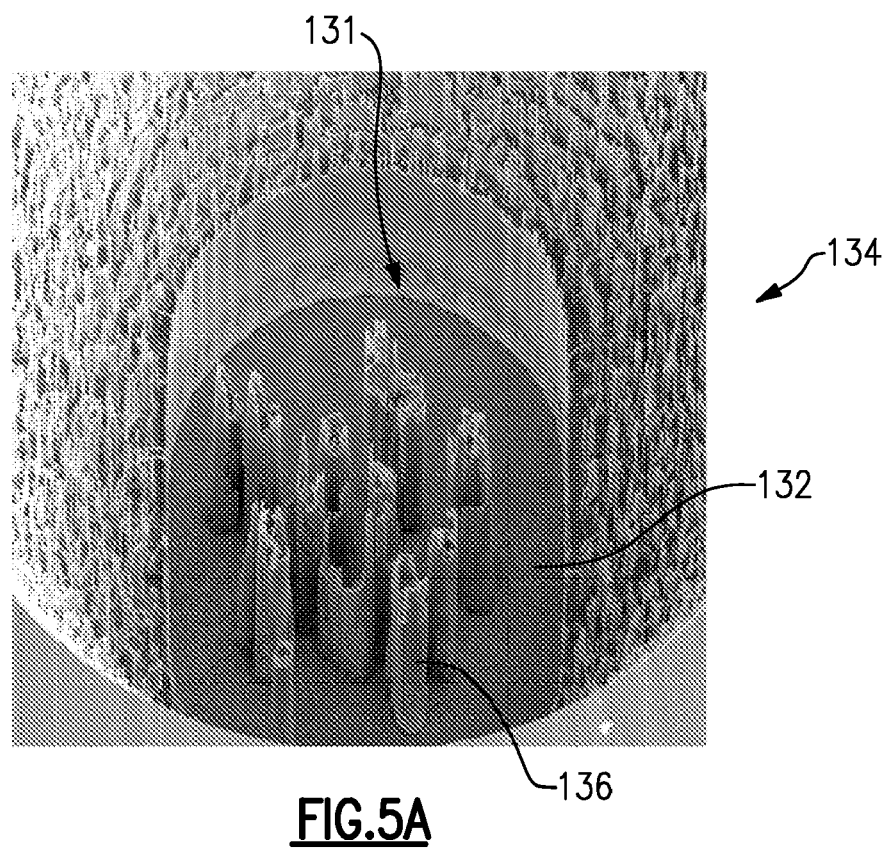
FIGS. 5A and 5B illustrate scanning electron microscope images of through-wafer vias with pillar formations.

FIG. 5A is a scanning electron microscope image 134 of a through-wafer via 131 having pillar formations 136. The pillar formations 136 can be formed when etching the through-wafer via 131 without sufficient removal of etching residues. For example, when the residues are not removed at a sufficient rate, the etching residues can deposit on the wafer 120 and can act as a mask to ions.

The pillar formations 136 have been formed on a first conductive layer 132. As described above, a second conductive layer can be subsequently deposited over the through-wafer via 131 to permit electrical connections between opposite surfaces of the wafer. When pillar formations 136 are present, formation of an electrical connection between opposite surfaces of the wafer can be inhibited. Thus, the presence of the pillar formations 136 or other structures not defined by a mask and/or photoresist layer can lead to electrically unreliable and/or inoperable through-wafer vias, and can consequently reduce yield.

Figure 5B:
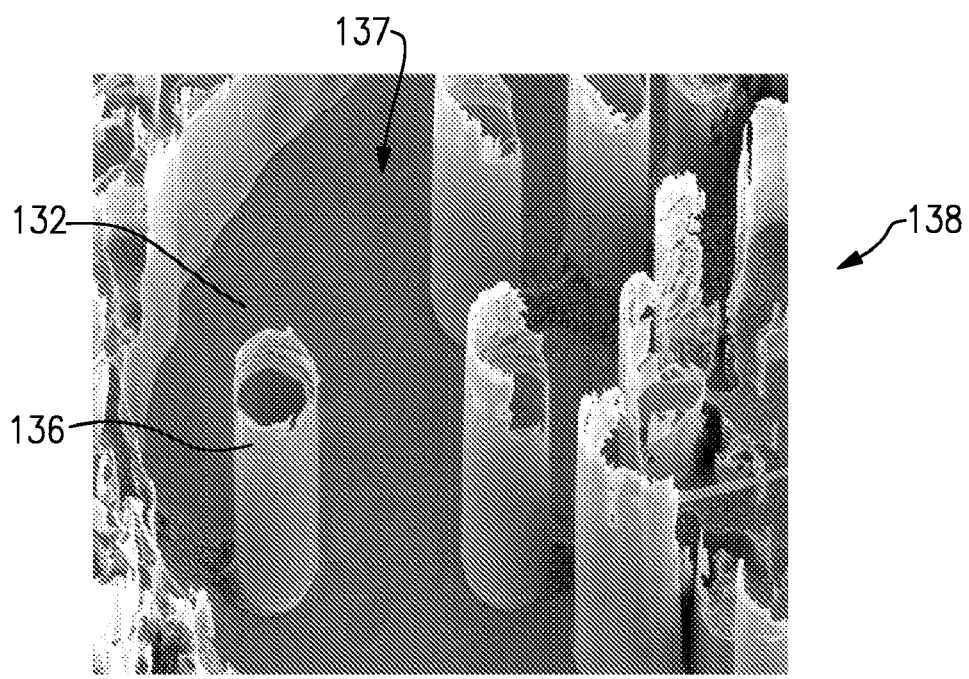

FIG. 5B is a scanning electron microscope image 138 of a through-wafer via 137 having pillar formations 136 formed on a surface of the first conductive layer 132. The pillar formations can have a diameter of about 1 µm.

Figure 6A:
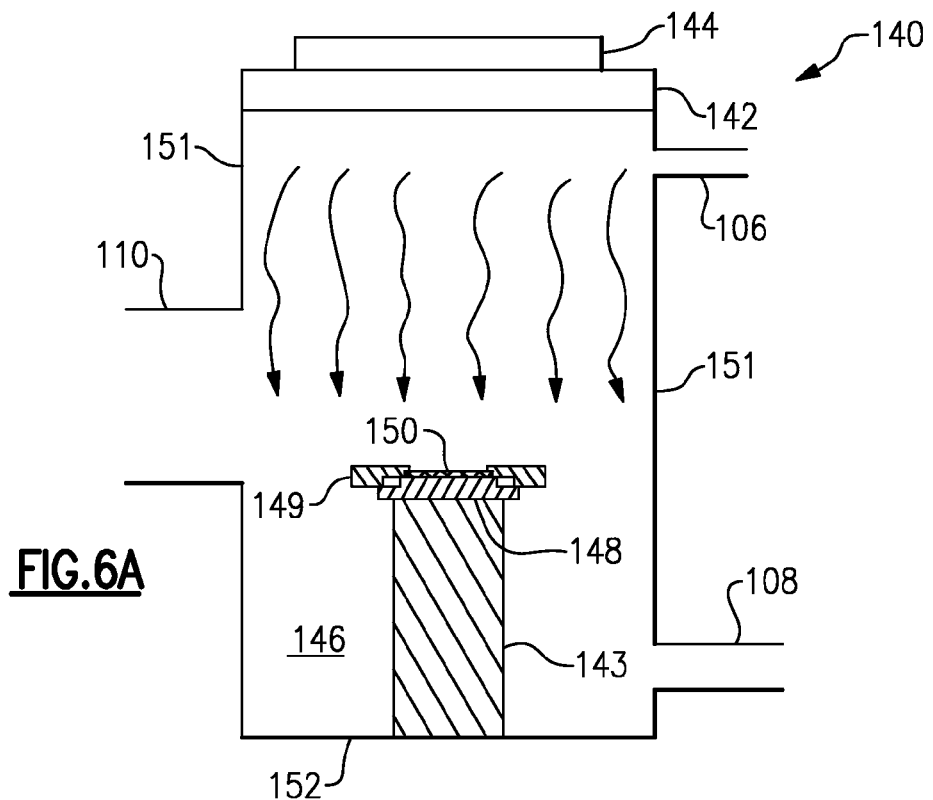
FIG. 6A is a cross-section of a plasma etcher in accordance with one embodiment.

FIG. 6A is a cross-section of a plasma etcher 140 in accordance with one embodiment. The plasma etcher 140 includes a gas source channel 106, an exhaust channel 108, a loading channel 110, an anode or first electrode 142, a cathode or second electrode 143, a power source 144, a chamber 146, a feature plate 148, a clamp 149, chamber walls 151, and chamber bottom 152. The plasma etcher 140 can be used to etch features on a wafer 150, such as through-wafer vias or other structures. The wafer 150 can be a GaAs wafer, and can be bonded to a carrier substrate, such as a sapphire substrate, to aid in forming the features on the wafer 150. In some instances, the wafer 150 can have a diameter of at least 6 inches.

The gas source channel 106 can be used to supply a plasma gas source to the chamber 146, as described above. The plasma source gas can include, for example, a gas containing chlorine such as $Cl_2$ and/or $BCl_3$. The power source 144 can apply a radio frequency voltage between the first and second electrodes 142, 143. The power source 144 can include, for example, induction coils or any other suitable RF power source. The power source 144 can apply an RF voltage between the first and second electrodes 142, 143, which can stimulate the plasma source gas within the chamber 146. The first and second electrodes 142, 143 can comprise any suitable material, including, for example, stainless steel. The exhaust channel 108 can aid in removing gases from the interior of the plasma etcher 102. Additional details of the exhaust channel 108 and the gas source channel 106 can be as described earlier, for example, in reference to FIG. 3.

The power source 144 can ionize a portion of the plasma source to form plasma containing electrons and positive ions. The electrons can respond to the varying electric fields produced by the RF power source 144, which can lead to the creation of sheath region near the electrodes having a net positive charge when averaged over a period of the RF driving voltage. The creation of the positive charged sheath region can create an electric field from the plasma to the wafer 150. Thus, ions 134 in the plasma can be accelerated by an electric field toward the wafer 150. The ions 134 can bombard the wafer 150, and can enhance chemical processes occurring at the surface of the wafer 150. Employing plasma can aid in processing wafers at relatively low temperatures compared to a process using only chemical methods.

The plasma etcher 140 can process samples in the chamber 146 at a relatively low pressure, such as a pressure of less than about 1 Torr. Processing wafers at a relatively low pressure can aid in delivering activation energy to a surface of a wafer using ions, while reducing the heat delivered to the wafer.

The chamber 146 includes chamber walls 151 and chamber bottom 152. The chamber walls 151 and the chamber bottom 152 can comprise any suitable material, including, for example, alumina. The thickness of the chamber walls 151 and chamber bottom 152 can be selected to provide sufficient structural rigidity to the chamber 146.

The plasma etcher 140 includes the feature plate 148 for holding the wafer 150. The feature plate 148 can be used to process a wide variety of samples, including wafers bonded to a nonconductive carrier, such as a sapphire carrier. The feature plate 148 can have a thickness enhanced relative to typical wafer chucks, as will be described later below.

The clamp 149 can be provided to aid in holding wafer 150 during processing. The clamp 149 can comprise, for example, alumina, and can be configured to mate with the feature plate 148. The clamp 149 can include recesses matched to the wafer 150 and/or the feature plate 148, to aid in holding the wafer 150 during processing. One embodiment of the clamp 149 is described in detail below with reference to FIGS. 14A-14B.

When etching relatively large features in the wafer 150, such as through-wafer vias, a relatively large amount plasma source gas can be provided to the chamber 146 and a relatively large power can be applied by the power source 144. This can permit the etching process to complete in a relatively short time, and can increase throughput of the plasma etcher 140. In one embodiment, the RF power ranges between about 100 W to about 1,200 W, and the amount of plasma source gas ranges between about 300 standard cubic centimeters per minute (sccm) to about 600 sccm. The relatively large amount of plasma source gas and power can increase the flux of ions and the amount of etch particulates and effluent gases, which can strain pumping from the exhaust channel 108 and can increase ion damage to components of the plasma etcher 140. Additionally, when particulates are not removed at a sufficient rate, etch byproducts can deposit on the wafer 150 and operate as a mask to ions, which can lead to the formation of pillars or other undefined structures, as was described above with reference to FIG. 5A-5B.

Figure 6B:
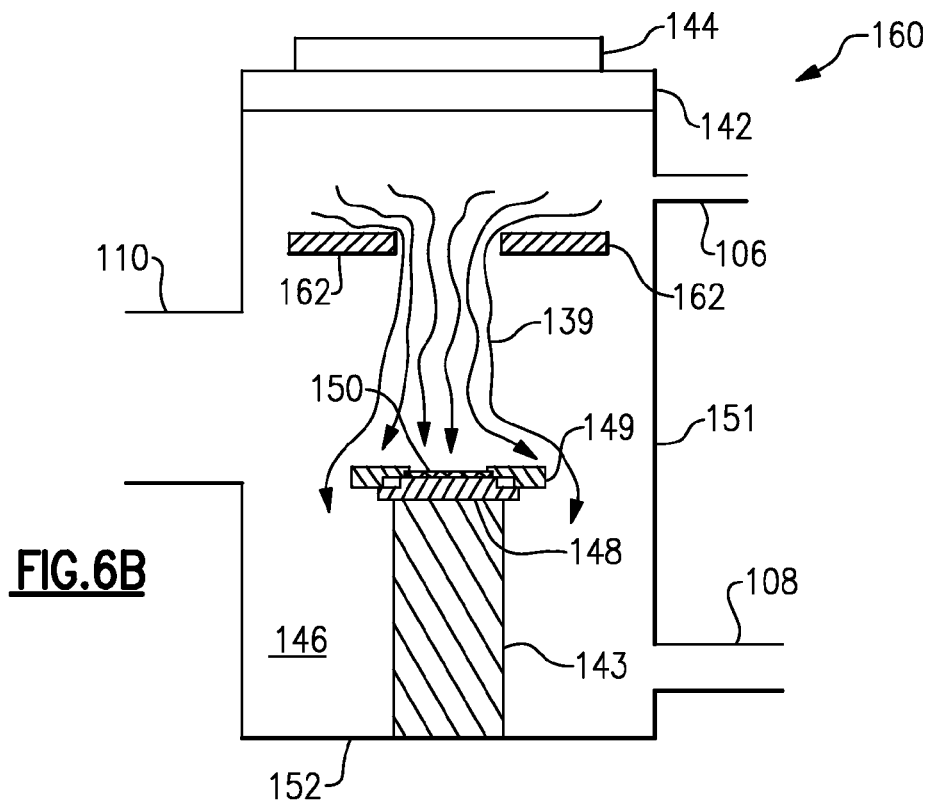
FIG. 6B is a cross-section of a plasma etcher in accordance with another embodiment.

FIG. 6B is a cross-section of a plasma etcher 160 in accordance with another embodiment. The plasma etcher 160 includes the gas source channel 106, the exhaust channel 108, the loading channel 100, the anode or first electrode 142, the cathode or second electrode 143, the power source 144, the chamber 146, the feature plate 148, the clamp 149, the chamber walls 151, and the chamber bottom 152, which can be similar to that described above with reference to FIG. 6A. However, in contrast to the plasma etcher 140 of FIG. 6A, the plasma etcher 160 of FIG. 6B further includes a plasma focus ring 162.

The plasma focus ring 162 can be substantially disc-shaped and can include an opening positioned at about the center of the ring. However, in other embodiments, the plasma focus ring 162 can comprise other shapes. As described above, the RF power source can create an electric field which can direct ions 139 toward the wafer 150. The ions 139 can reach the plasma focus ring 162, and can pass through the opening of the ring 162 under the influence of an electric field.

Employing the plasma focus ring 162 can increase the flux of ions 139 provided to the wafer 150, which can increase the rate of reactions taking place on the surface of the wafer 150. Additionally, use of the plasma focus ring 162 can reduce the amount of plasma source gas needed in the chamber to achieve a given amount of etching. Thus, the plasma focus ring 162 can make the volume of the chamber effectively smaller. For a plasma etcher having a limited pumping capability through exhaust channel 108, the use of the plasma focus ring 162 can reduce the amount of effluent gases relative to a scheme in which the plasma source gas and RF power provided to the power source 144 are each increased to improve the etching rate at the surface of the wafer 150. By using the plasma focus ring 162 to focus plasma, the quantity of effluent gases can be kept sufficiently low such that the exhaust channel 108 can adequately remove gases and reactants and avoid the formation of pillars or other structures not defined by a mask and/or photoresist layer.

Figure 7A:
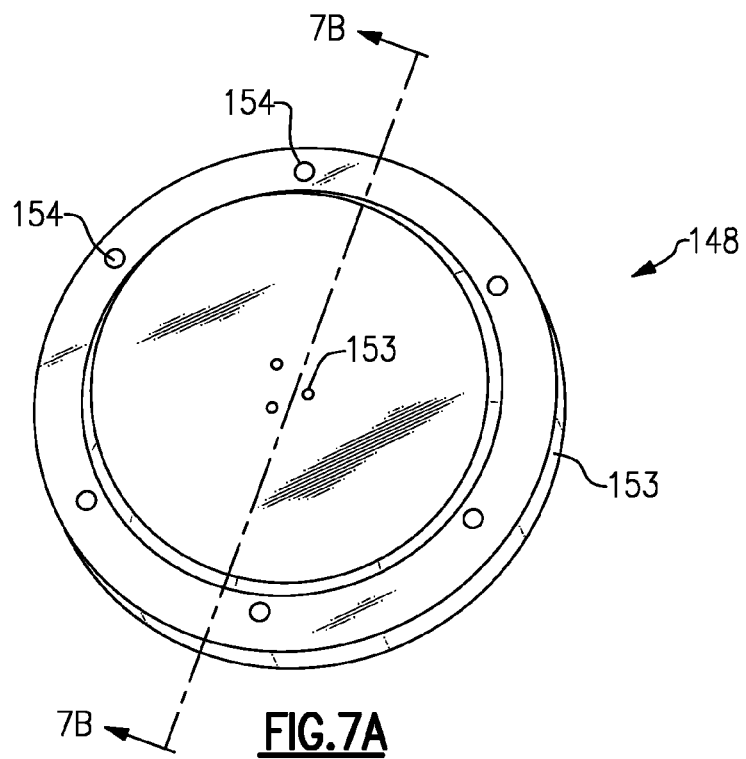
FIG. 7A is a perspective view of a feature plate in accordance with one embodiment.
Figure 7B:
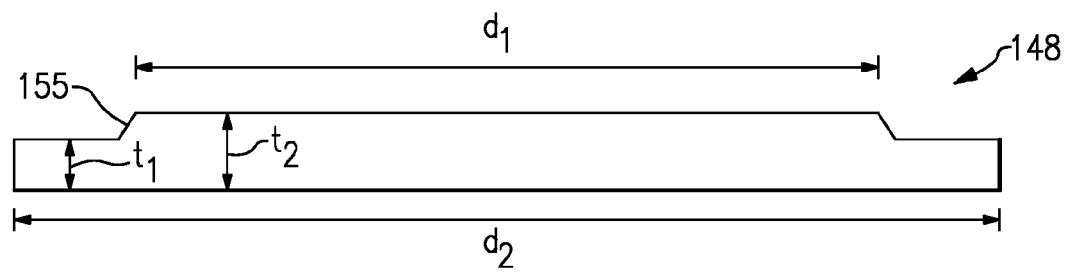
FIG. 7B is a cross-section of the feature plate of FIG. 7A taken along the line 7B-7B.

FIG. 7A is a perspective view of the feature plate 148 of FIGS. 6A-6B. FIG. 7B is a cross-section of the feature plate 148 of FIG. 7A. The feature plate 148 includes cooling holes 153 and mounting holes 154. The cooling holes 153 can be used for cooling the sample using, for example, helium, which can aid in avoiding burning of a photoresist layer, such as the photoresist layer 128 of FIG. 4B. As described above, the feature plate 148 can hold a sample, such as a GaAs wafer mounted to a sapphire carrier. Although the feature plate 148 is illustrated for the case of three cooling holes 153, more or fewer cooling holes 153 can be provided.

The feature plate 148 can be formed from any suitable material, including, for example, aluminum. The feature plate 148 can have an inner diameter $d_1$, and an outer diameter $d_2$. The inner diameter $d_1$ can be sized to hold a sample, such as a semiconductor wafer mounted to a carrier and having a diameter of at least about 6 inches. In one embodiment, the inner diameter $d_1$ is in the range of about 6 inches to about 8 inches, for example, about 6.373 inches, and the outer diameter $d_2$ has a diameter configured to be equal to about that of the outer diameter of the cathode 143.

The thickness $t_2$ of a portion of the feature plate 148 within the inner diameter $d_1$ can be relatively thicker than a thickness $t_1$ of a portion of the plate between the inner diameter and the outer diameter. For example, the thickness $t_2$ can be in the range of about 0.2 inches to about 0.5 inches, for example, about 0.328 inches, while the thickness $t_1$ can be in the range of about 0.1 inches to about 0.3 inches, for example, about 0.2 inches. The feature plate 153 can be relatively thick to aid in protecting the feature plate 153 from damage. For example, as will be described in detail below with reference to FIGS. 13-15, in certain embodiments plasma ions can reach the feature plate 148, and the feature plate 148 can have an increased thickness for enhanced protection.

As illustrated in FIG. 7B, the feature plate 148 can include a sloped side 155, which can be used to mate the feature plate 148 with a corresponding sloped side on the clamp 149, as will be described in further detail below. The sloped side 155 can have any suitable angle, such as an angle of about 45 degrees.

The mounting holes 154 can be used to connect the feature plate 148 to a cathode, such as the cathode 143 of FIG. 6B. Although six mounting holes 154 are illustrated, any suitable number of mounting holes 154 can be employed. The mounting holes 154 can be configured to receive, for example, a screw or pin.

Figure 8:
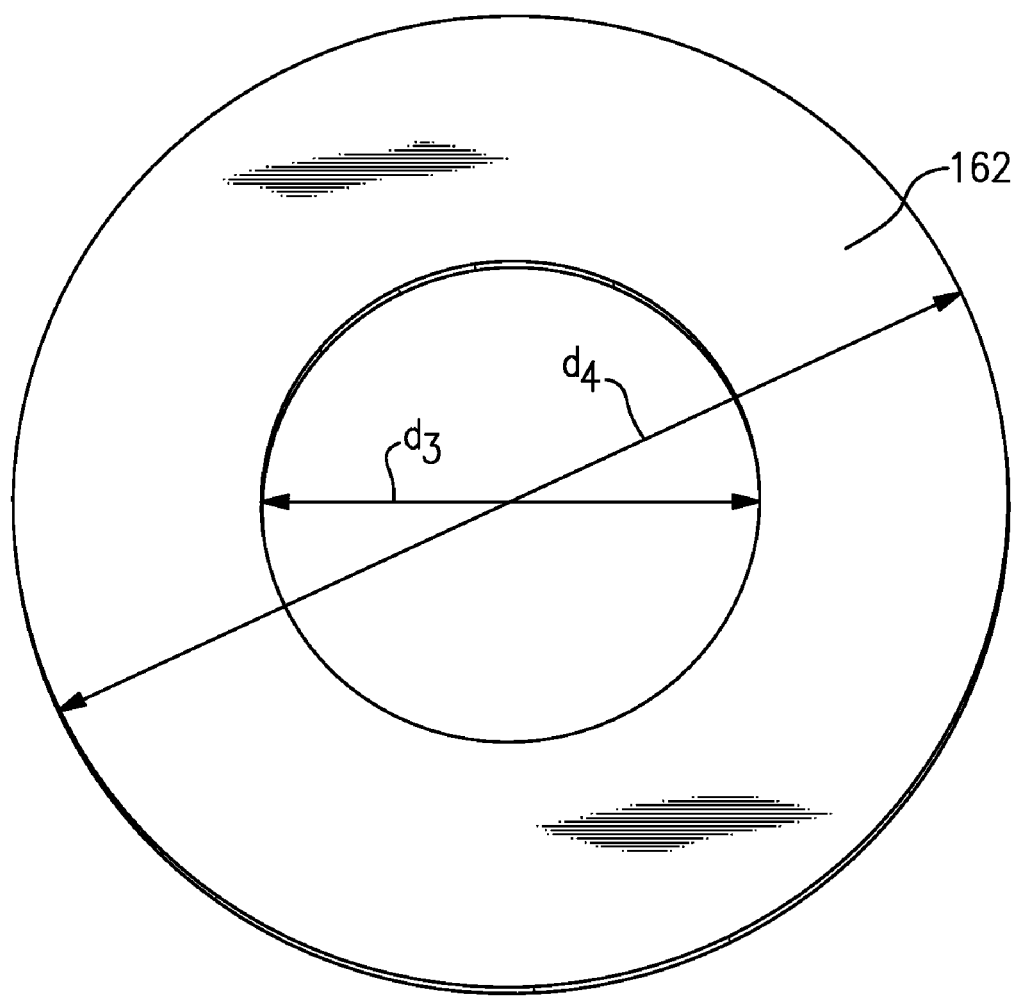
FIG. 8 is a perspective view of a focus ring in accordance with one embodiment.

FIG. 8 is a perspective view of the focus ring 162 of FIG. 6B. The focus ring 162 has an inner diameter $d_3$ and an outer diameter $d_4$. In one embodiment, the inner diameter $d_3$ is in the range of about 5 inches to about 12 inches, for example, about 8 inches. The outer diameter $d_4$ can be any suitable diameter, such as a diameter of about 14 inches. The outer diameter $d_4$ can be configured to match the inner diameter of the chamber 146. The focus ring 162 can comprise any suitable material, including, for example, a ceramic, and can have a variety of thicknesses, such as a thickness in the range of about 0.1 inches to about 0.2 inches, for example, about 0.125 inches.

Figure 9:
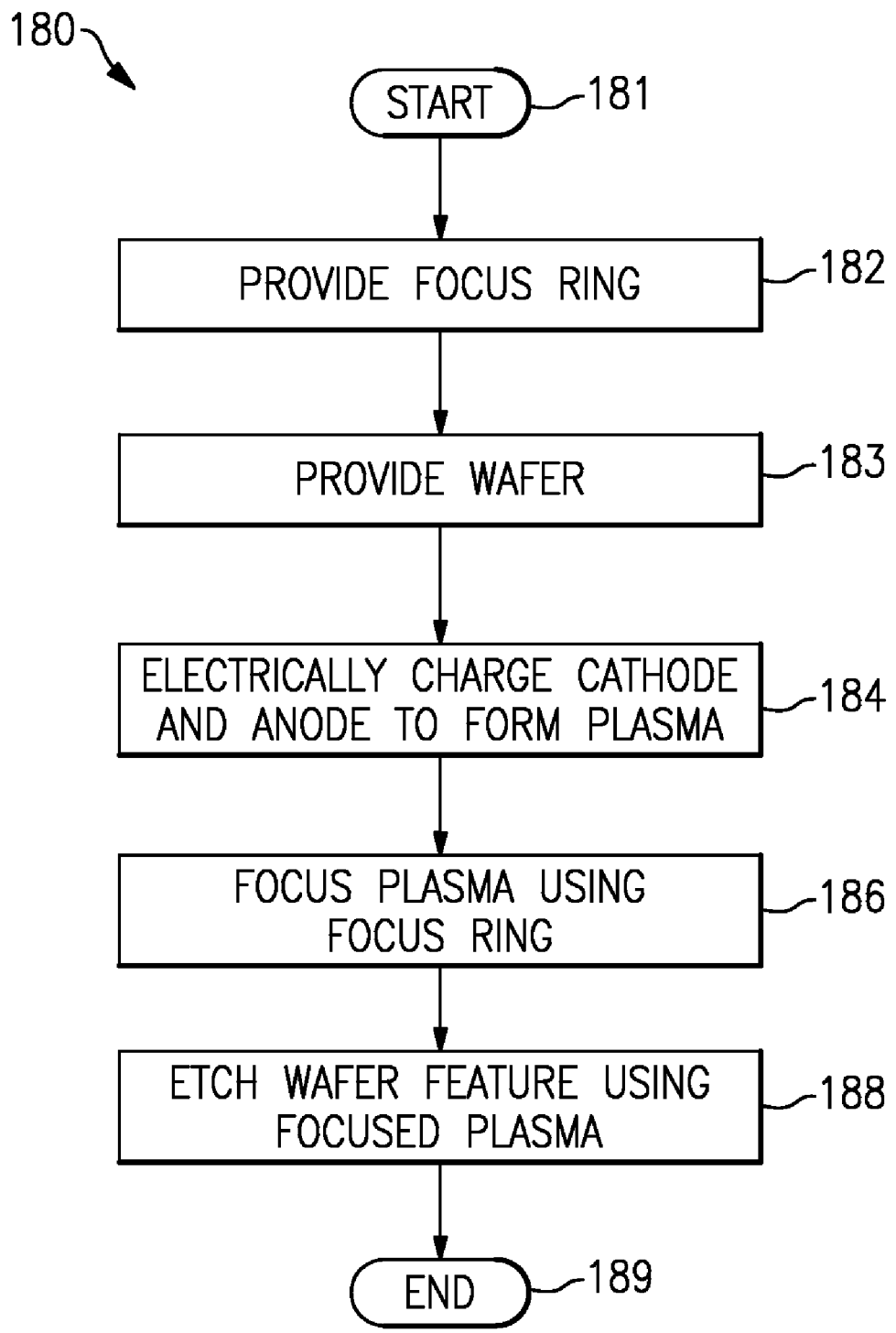
FIG. 9 is a flowchart illustrating a method of etching a wafer feature in accordance with one embodiment.

FIG. 9 is a flowchart illustrating a method 180 of etching a wafer feature in accordance with one embodiment. It will be understood that the methods discussed herein may include greater or fewer operations and the operations may be performed in any order, as necessary. Any combination of the features of method 180 may be embodied in a non-transitory computer readable medium and stored in non-volatile computer memory. When executed, the non-transitory computer readable media may cause some or all of the method 180 to be performed. The illustrated method can be used to etch a wafer feature, such as the through-wafer via 125 of FIGS. 4B-4C.

The method 180 for etching a wafer feature starts at block 181. In an ensuing block 182, a focus ring is provided. For example, as described above, a plasma focus ring can be positioned between the anode and cathode within a chamber of a plasma etcher. The focus ring can have an opening for passing plasma ions. The plasma focus ring can comprise any suitable materials, such as $Al_2O_3$ (alumina).

In an ensuing block 183, a wafer is provided. The wafer can be, for example, a GaAs wafer having a diameter of at least about 6 inches. The wafer can be mounted on any suitable carrier, such as a sapphire carrier. The wafer can be positioned in the chamber using any suitable method, including, for example, using robotics to provide the wafer through a loading channel onto a feature plate.

The method 180 continues at a block 184, in which a cathode and an anode are electrically charged to form plasma. For example, a RF power source can be provided between an anode and a cathode in a plasma etcher having a chamber filled with a plasma source gas, such as a gas containing chlorine. The RF power source can excite the plasma source gas, and can generate plasma.

In an ensuing block 186, plasma ions are focused using the plasma focus ring. As described earlier, an electric field can accelerate plasma ions toward the wafer. A focus ring can be provided in the path of the ions, and the ions can pass through an opening of the plasma focus ring. The plasma focus ring can increase the flux of the ions delivered to the wafer.

The method 180 continues at a block 188, in which a wafer feature is etched using the focused plasma. The wafer feature can be a relatively large feature, such as a through-wafer via, as described earlier. Employing the plasma focus ring can increase the rate of reactions which take place on the surface of a wafer. The use of the plasma focus ring can reduce the amount of plasma source gas needed within the chamber of the plasma etcher to achieve a desired level of etching at the surface of the wafer. For a plasma etcher having a limited pumping capability, the use of the plasma focus ring can reduce the amount of effluent gases relative to a scheme in which the plasma focus ring is omitted. Thus, the quantity of effluent gases can be kept low enough for effluent gases and etch byproducts to be sufficiently removed.

Improving the removal of reactants and effluent gases from the chamber can prevent etch byproducts from acting as a mask to ions arriving at the surface of the wafer. For example, failure to remove particulates at a sufficient rate during formation of a through-wafer via can lead to the particulates acting as a mask for the plasma ions and can lead to the formation of structures within the through-wafer via, such as pillars, as was described above with reference to FIG. 5A-5B. The method ends at 189.

Figure 10:
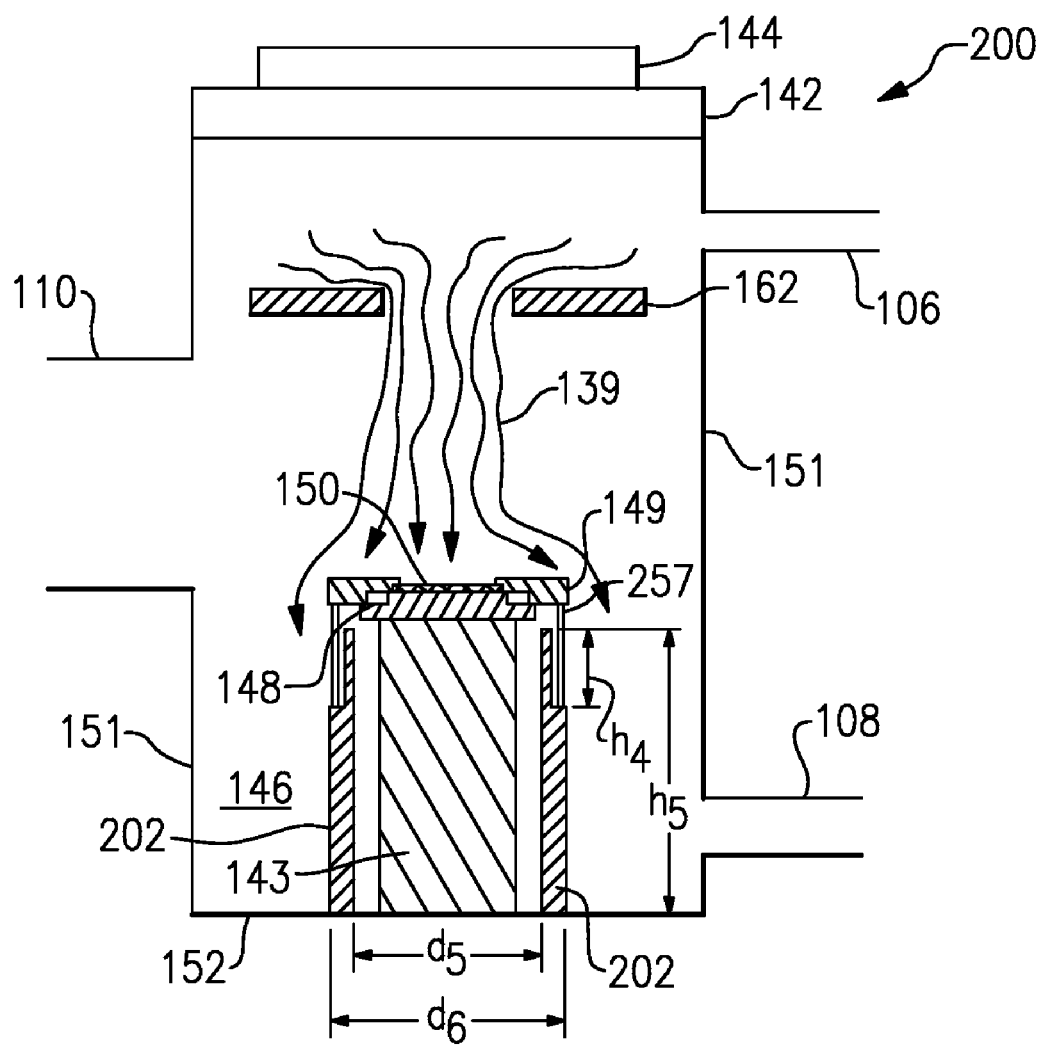
FIG. 10 is a cross-section of a plasma etcher in accordance with yet another embodiment.

FIG. 10 is a cross-section of a plasma etcher 200 in accordance with yet another embodiment. The plasma etcher 200 includes the gas source channel 106, the exhaust channel 108, the loading channel 110, the anode or first electrode 142, the cathode or second electrode 143, the power source 144, the chamber 146, the feature plate 148, the clamp 149, the chamber walls 151, and the chamber bottom 152, which can be as described earlier. In contrast to the plasma etcher 160 of FIG. 6B, the plasma etcher 200 further includes an electrode shield 202.

The electrode shield 202 can be used to protect the cathode 143 from damage. For example, when etching relatively large features in the wafer 150, such as through-wafer vias, a relatively large power can be applied by the power source 144 and a relatively large amount of plasma source gas can be supplied using the gas source channel 106. This can aid in completing the etching process in a relatively short time, so as to increase throughput of the plasma etcher 200. However, applying a relatively large amount of plasma source gas and a relatively large power can increase the number of ions 139 in certain regions of the chamber, such as a region of the chamber near the cathode 143. The ions 139 can have a relatively high energy and can cause damage to the cathode 143. Since the cathode 143 can be relatively expensive and difficult to replace, the electrode shield 202 can be used to reduce the number of ions 139 impacting the cathode 143.

The electrode shield 202 can perform functions in addition to protecting the cathode 143. For example, the electrode shield 202 can surround the cathode 143 and can prevent the formation of plasma pockets near the cathode 143, which can contribute to RF dropouts. Thus, the inclusion of the electrode shield 202 can enhance the electrical characteristics of a plasma etcher.

The electrode shield 202 can comprise any suitable material, including for example, a ceramic, such as alumina. The electrode shield 202 can be shaped as a cylindrical drum having an outer diameter $d_6$ and an inner diameter $d_5$. The inner diameter $d_5$ can be larger than the diameter of the cathode 143 to permit the electrode shield 202 to surround the cathode 143. In one embodiment, the inner diameter $d_5$ is selected to be in the range of about 8.2 inches to about 8.5 inches, for example, about 8.374 inches, and the outer diameter $d_6$ is selected to be in the range of about 9 inches to about 10 inches, for example, about 9.69 inches.

The inner diameter $d_5$ can be selected to provide a sufficient spacing between the electrode shield 202 and the cathode 143 so as to avoid hindering the electrical operation of the cathode 143 and the formation of plasma within the chamber. For example, the electrode shield 202 can be spaced from the cathode 143 by a distance in the range of about 0.05 inches to about 0.1 inches.

The electrode shield 202 can have a total height $h_5$, which can be selected to be equal to about the height of the cathode 143 to aid in protecting the cathode 143, including a portion of the cathode 143 near the feature plate 148. The electrode shield 202 can include a region of reduced thickness having a height $h_4$ to permit the electrode shield 202 to connect to the chamber bottom 152 and/or to permit rods 257 or other structures to connect between the clamp 149 and the electrode shield 202. The rods 257 can be used to secure the clamp 149 against the feature plate 148, while permitting the clamp 149 to be selectively raised to allow for the wafer 150 to be inserted and removed. In one embodiment, the total height $h_5$ of the electrode shield 202 is in the range of about 3.5 inches to about 4 inches, for example, about 3.995 inches, and the height $h_4$ of the reduced thickness region is in the range of about 1.2 inches to about 1.54 inches, for example, about 1.532 inches. As shown in FIG. 10, the dark shield can be spaced from the feature plate by a gap so as to avoid interfering with the electrical operation of the plasma etcher. The gap can be relatively small to aid in providing enhanced protection to the cathode 143 from plasma ions. In one embodiment, the gap is in the range of about 0.1 inches to about 0.4 inches.

Figure 11A:
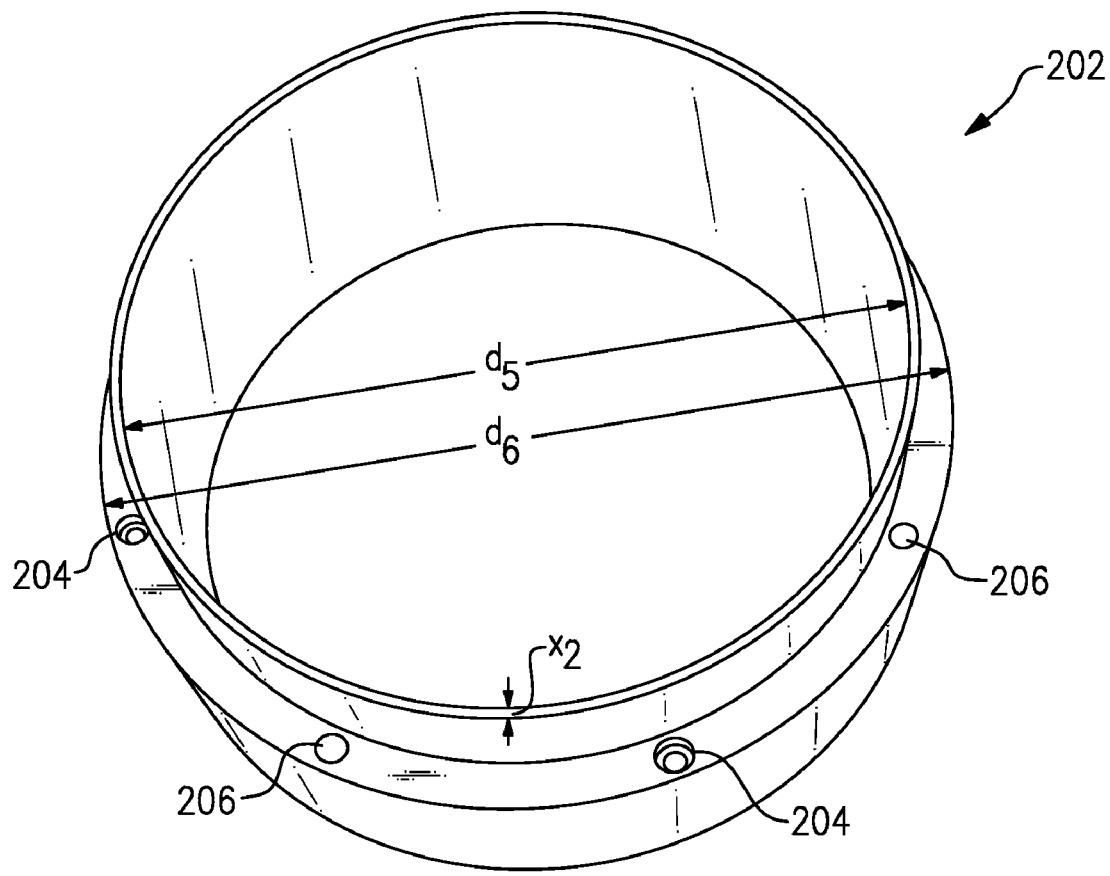
FIG. 11A is perspective view of an electrode shield in accordance with one embodiment.
Figure 11B:
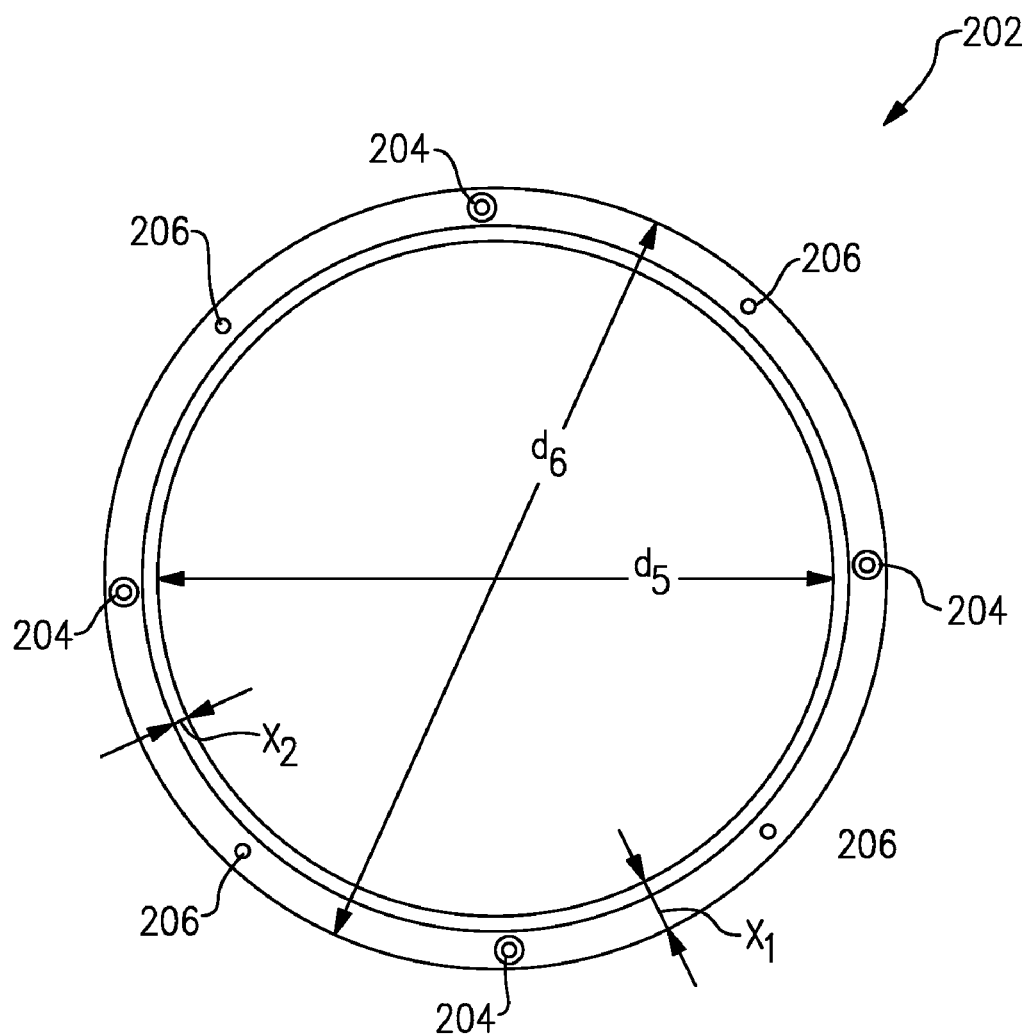
FIG. 11B is a top plan view of the electrode shield of FIG. 11A.

FIG. 11A is perspective view of the electrode shield 202 of FIG. 10. FIG. 11B is a top plan view of the electrode shield 202. As described above, the electrode shield 202 can be used for shielding a cathode, such as the cathode 143 of FIG. 10.

The electrode shield 202 can be formed from any suitable material, including, for example, aluminum. The electrode shield 202 can have a total thickness $x_1$, which can be in the range of about 0.5 inches to about 0.8 inches, for example, about 0.658 inches. The electrode shield 202 can include a region of reduced thickness $x_2$, which can be in the range of about 0.1 inches to about 0.2 inches, for example, about 0.106 inches.

The region of reduced thickness can provide room for structures for connecting the electrode shield 202 to other structures of the plasma etcher, such as a chamber bottom or a clamp. For example, the electrode shield 202 includes mounting holes 204 and rod holes 206. The mounting holes 204 can be used to permit the electrode shield 202 to be mounted to the plasma etcher using, for example, screws or pins. The rod holes 206 can permit passage of rods for connecting a clamp to the chamber bottom, thereby allowing the clamp to be selectively raised or lowered to allow for insertion and removal of a wafer.

Although the electrode shield 202 has been illustrated as having four mounting holes 204 and four rod holes 206, more or fewer mounting holes 204 and/or rod holes 206 can be employed. Furthermore, in certain embodiments, the mounting holes 204 and/or rod holes 206 can be omitted. Additional details of the electrode shield 202 can be as described above with reference to FIG. 10.

Figure 12:
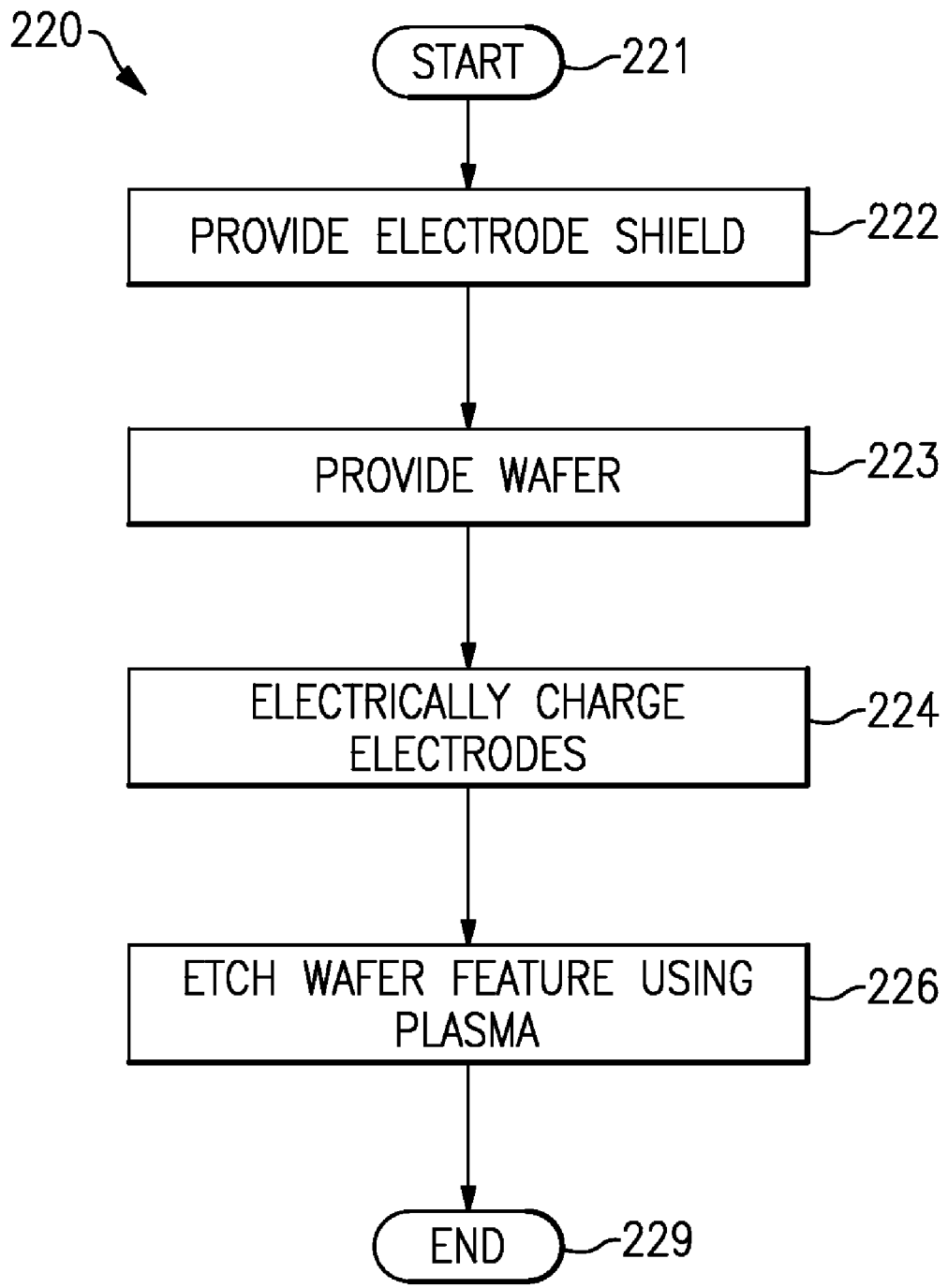
FIG. 12 is a flowchart illustrating a method of etching a wafer feature in accordance with another embodiment.

FIG. 12 is a flowchart illustrating a method 220 of etching a wafer feature in accordance with another embodiment. The method 220 is depicted from the point of view of a plasma etcher, such as the plasma etcher 200 of FIG. 10. It will be understood that the methods discussed herein may include greater or fewer operations and the operations may be performed in any order, as necessary. Any combination of the features of method 220 may be embodied in a non-transitory computer readable medium and stored in non-volatile computer memory. When executed, the non-transitory computer readable media may cause some or all of the method 220 to be performed. The illustrated method can be used to etch a wafer feature, such as the through-wafer via 125 of FIGS. 4B-4C.

The method 220 for etching a wafer feature starts at 221. In an ensuing block 222, an electrode shield is provided. The electrode shield can be substantially shaped as a cylindrical drum, and can have a hollow interior configured to surround the outer circumference of an electrode, such as a cathode. The electrode shield can be spaced from the electrode so as to avoid hindering electrical operation of the plasma etcher. The electrode shield can comprise any suitable material, such as aluminum.

In an ensuing block 223, a wafer is provided. The wafer can be, for example, a GaAs wafer having a diameter of at least about 6 inches. The wafer can be mounted on any suitable carrier, such as a sapphire carrier having a diameter greater than that of the wafer.

The method 220 continues at a block 224, in which electrodes are electrically charged to form plasma. For example, a RF power source can be provided between a first and second electrode in a plasma etcher having a chamber filled with a plasma source gas. The RF power source can excite the plasma source gas and generate plasma. The electrode shield can surround the circumference of one of the electrodes, and can be spaced from the electrode so as to avoid hindering electrical operation of the plasma etcher. The plasma etcher can include a plasma focus ring, as described above, and an electric field can accelerate plasma ions toward the wafer. The electrode shield can protect the electrode, even when a plasma focus ring has increased the flux of ions in a region of the electrode near the wafer.

The method 220 continues at a block 226, in which a wafer feature is etched using the plasma. The wafer feature can be a relatively large feature, such as a through-wafer via, as was described earlier. During the etching process, the electrode shield can be used to protect one of the electrodes. When etching relatively through-wafer vias or other relatively large features, a large amount of plasma source gas can be used and a relatively large amount of power can be applied by an RF power source. The resulting ions can have a relatively large flux in certain regions of the chamber, such as a region of an electrode near the wafer. The ions can be accelerated with a relatively large energy toward the electrode. Since the electrode can be relatively expensive and difficult to replace, the electrode shield can be used to reduce the number of ions impacting the electrode. The method 220 ends at 229.

Figure 13:
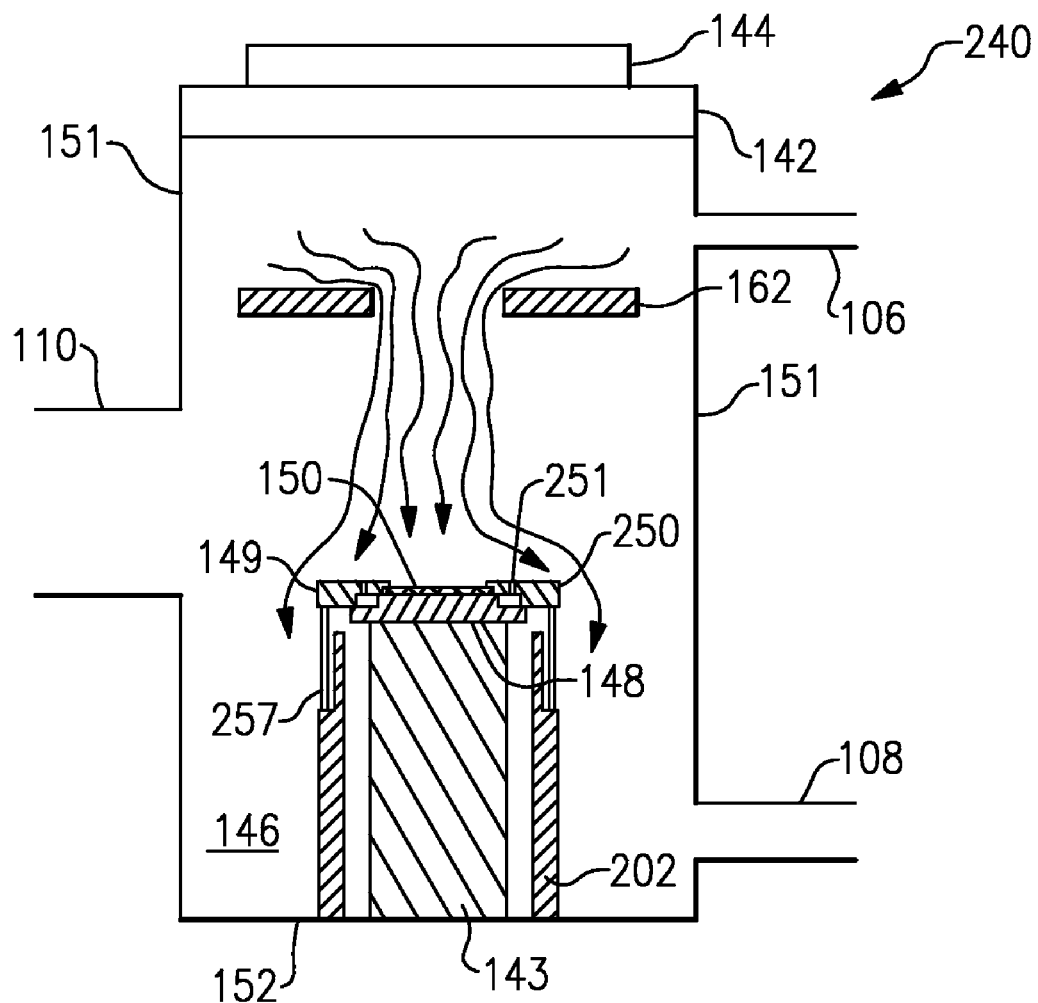
FIG. 13 is a cross-section of a plasma etcher in accordance with yet another embodiment.

FIG. 13 is a cross-section of a plasma etcher 240 in accordance with yet another embodiment. The plasma etcher 240 includes the gas source channel 106, the exhaust channel 108, the loading channel 110, the anode or first electrode 142, the cathode or second electrode 143, the power source 144, the chamber 146, the feature plate 148, the clamp 250, the chamber walls 151, the chamber bottom 152, and the electrode shield 202, which can be as described earlier. In contrast to the plasma etcher 200 of FIG. 10, the clamp 250 of the plasma etcher 240 includes one or more electrical measurement holes 251.

As described above, when etching relatively large features on the wafer 150, such as through-wafer vias, a relatively large power can be applied by the power source 144 and a relatively large amount plasma source gas can be supplied using the gas source channel 106. To protect the cathode 143, the electrode shield 202 can be provided. To permit measurement of electrical characteristics near the wafer, such as a DC bias measurement, the electrical measurement holes 251 can be provided. The electrical measurement holes 251 permit plasma ions to pass through the clamp 149 and to impact the feature plate 148, thereby permitting improved measurement of electrical characteristics near the wafer 150, even in embodiments in which the electrode shield 202 surrounds the cathode 143. Since the feature plate 148 can be relatively inexpensive and simpler to replace compared to the cathode 143, ion damage to the feature plate 148 can be tolerated to a greater extent than ion damage to the cathode 143.

Measurement of electrical characteristics near the wafer, such as DC bias, can aid in improving control of the etching rate at the surface of the wafer 150. For example, etching rate is related to ion energy, which can depend on the electrical potential of the anode 142 relative to the electrical potential near the wafer 150. Since the impedance of the plasma etcher can affect the electrical potential near the wafer 150, it can be difficult to determine the amount of RF power to apply using the power source 144 to achieve the desired ion energy level. For example, chamber losses, including those from standing wave effects and/or the skin effect, can lead to variation in the electrical potential near the wafer 150. The variation in electrical potential can be exacerbated at the relatively high RF powers and frequencies associated with forming through-wafer vias, in which impedance losses can be relatively large.

The measurement holes 251 permit ions to reach the feature plate 148, and thus improve measurement of electrical characteristics and permit improved etch rate control using the power source 144. Additional details of the clamp 250 and the measurement holes 251 can be as described below.

Figure 14A:
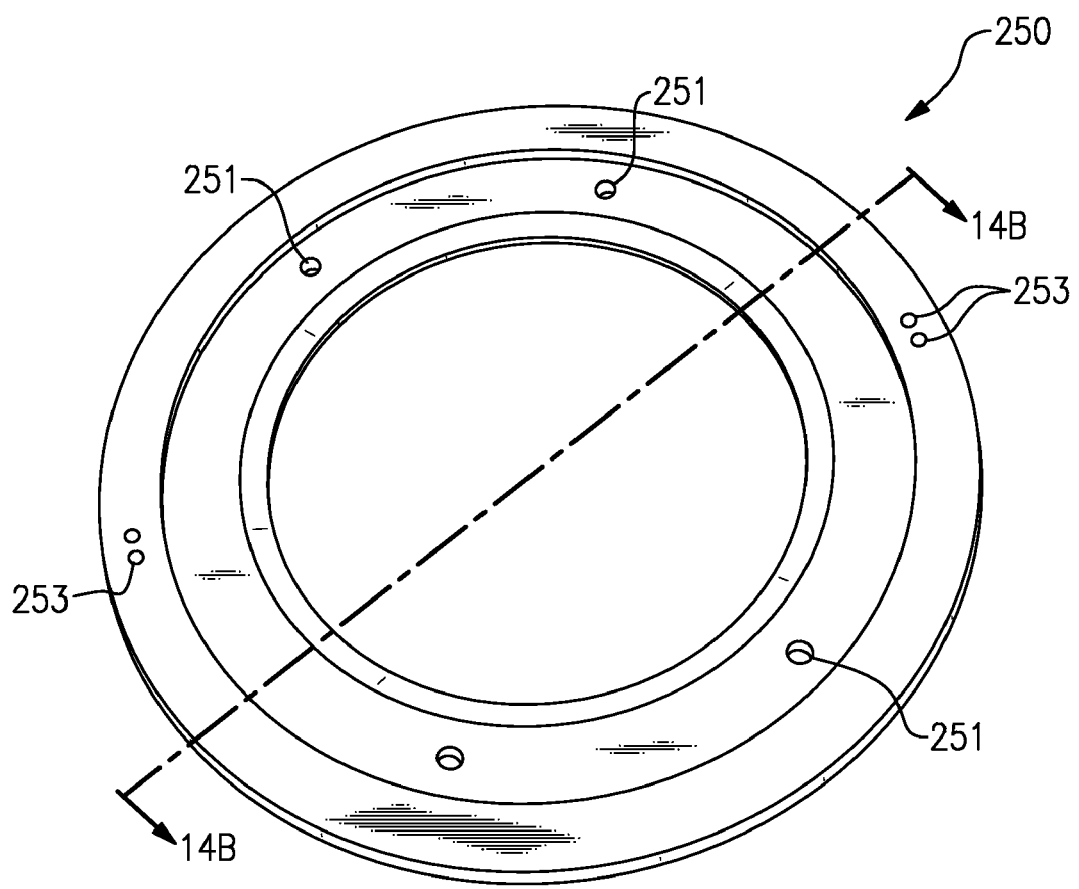
FIG. 14A is a bottom perspective view of a clamp in accordance with one embodiment.
Figure 14B:
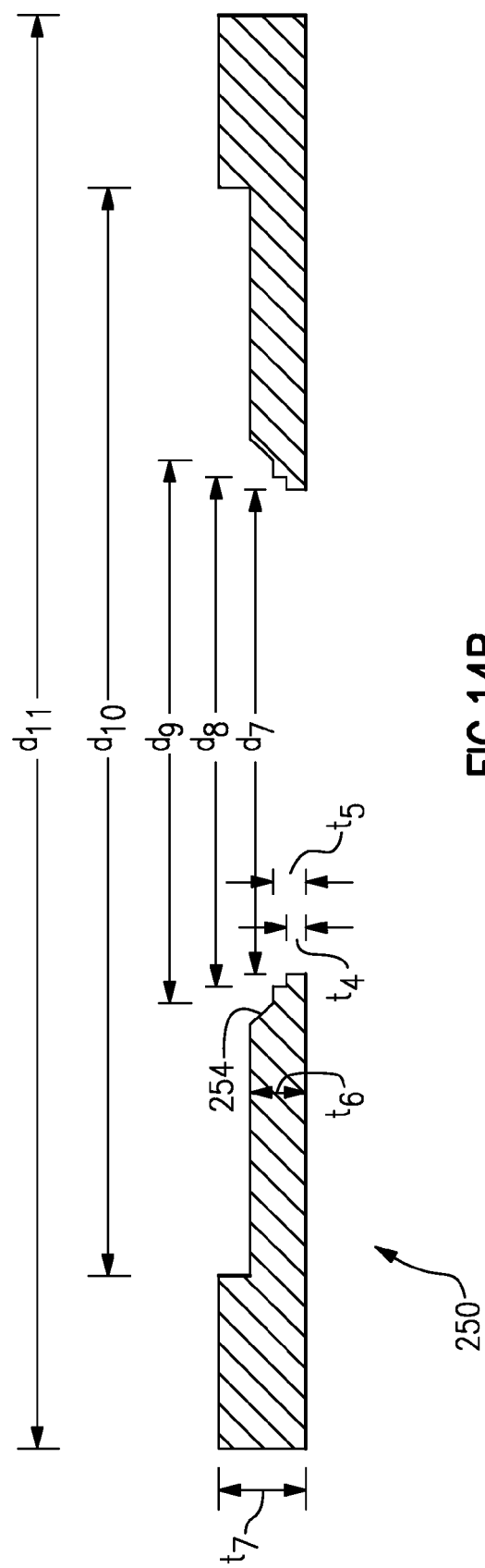
FIG. 14b is a cross-section of the clamp of FIG. 14A taken along the line 14B-14B.

FIG. 14A is a bottom perspective view of the clamp 250 of FIG. 13. FIG. 14B is a cross-section of the clamp 250 of FIG. 14A taken along the line 14B-14B.

The clamp 250 includes the measurement holes 251, and mounting holes 253. The measurement holes 251 can have any suitable diameter for permitting the passage of ions, including a diameter in the range of about 0.2 inches to about 0.7 inches. Employing a plurality of measurement holes 251 can reduce the frequency of obstruction of the measurement holes 251 caused by particular build-up, and can reduce the concentration of ion damage to the underlying feature plate. In one embodiment, the number of measurement holes 251 is selected to be in the range of about one to about six, for example, about four.

The mounting holes 253 can be used for attaching the clamp 250 to a plasma etcher. For example, the mounting holes 253 can be used for attaching rods, such as the rods 257, to the clamp 250. Although four mounting holes 253 are illustrated, any suitable number of mounting holes 253 can be employed. Additionally, in certain embodiments, the mounting holes 253 can be omitted.

The clamp 250 can be configured to mate with a wafer and/or a feature plate. For example, the clamp 250 can have a first diameter $d_7$ and a first thickness $t_4$ for holding a wafer and a second diameter $d_8$ and a second thickness $t_5$ for holding a carrier substrate for a wafer. Thus, the first and second diameters $d_7$, $d_8$ and the first and second thicknesses $t_4$, $t_5$ of the clamp 250 can be selected so that the clamp 250 can hold a thinned GaAs wafer bonded to a sapphire carrier. In one embodiment, the first diameter $d_7$ is in the range of about 4 inches to about 8 inches, for example, about 6.1 inches, the second diameter $d_8$ is in the range of about 4.2 inches to about 8.2 inches, for example, about 6.24 inches, the first thickness $t_4$ is in the range of about 0.05 inches to about 0.3 inches, for example, about 0.1 inches, and the second thickness $t_5$ is in the range of about 0.1 inches to about 0.3 inches, for example, about 0.2 inches.

The clamp 250 can include a third diameter $d_9$ defining the location of a sloped side 254. The sloped side 254 can have an angle configured to mate with a feature plate. For example, the sloped side 254 of the clamp 250 can be configured to mate with the sloped side 155 of the feature plate 148. In one embodiment, the third diameter $d_9$ is in the range of about 4 inches to about 8 inches, for example, about 6.4 inches.

The clamp 250 can also include fourth diameter $d_{10}$ and an outer diameter $d_{11}$. A portion of the clamp 250 between the third diameter $d_9$ and the fourth diameter $d_{10}$ can have a third thickness $t_6$, and can define a gap between the clamp 250 and a feature plate when the clamp 250 holds a wafer. The portion of the clamp 250 between the fourth diameter $d_{10}$ and the outer diameter $d_{10}$ can have a fourth thickness $t_7$, which can represent the total thickness of the clamp 250. In one embodiment, the third diameter $d_9$ is in the range of about 4.5 inches to about 8.5 inches, for example, about 6.7 inches, the outer diameter $d_{10}$ is in the range of about 7 inches to about 9 inches, for example, about 8.45 inches, the third thickness $t_6$ is in the range of about 0.15 inches to about 0.35 inches, for example, about 0.24 inches, and the fourth thickness $t_7$ is in the range of about 0.3 inches to about 0.6 inches, for example, about 0.432 inches.

Figure 15:
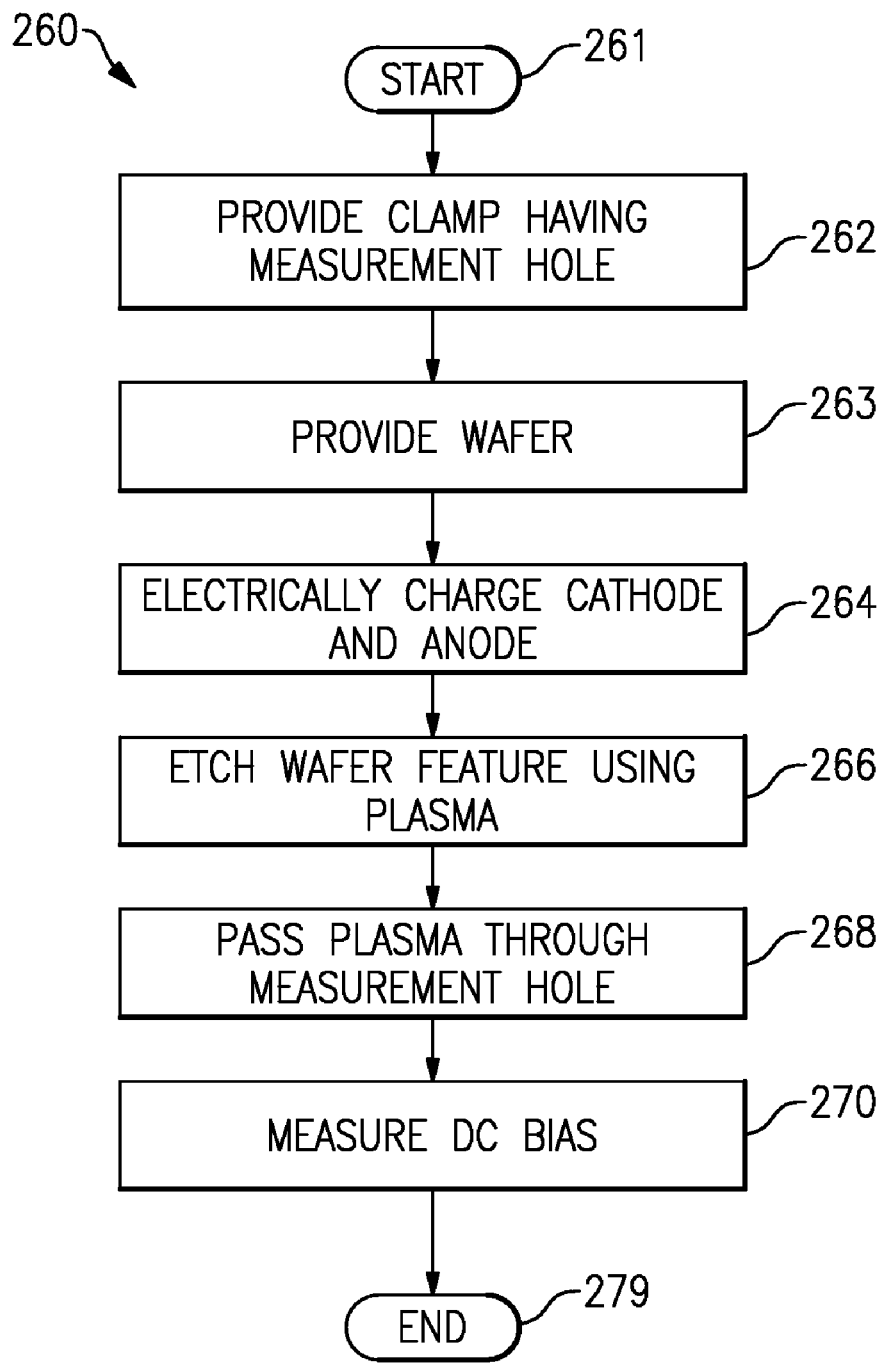
FIG. 15 is a flowchart illustrating a method of etching a wafer feature in accordance with yet another embodiment.

FIG. 15 is a flowchart illustrating a method 260 of etching a wafer feature in accordance with yet another embodiment. The method 260 is depicted from the point of view of a plasma etcher, such as the plasma etcher 240 of FIG. 13. It will be understood that the methods discussed herein may include greater or fewer operations and the operations may be performed in any order, as necessary. The illustrated method can be used to etch a wafer feature, such as the through-wafer via 125 of FIGS. 4B-4C.

The method 260 for etching a wafer feature starts at 261. In an ensuing block 262, a clamp having at least one electrical measurement hole is provided. The clamp can be used to secure a wafer against a feature plate, and the electrical measurement hole can used for measuring a variety of electrical characteristics, including, for example, a DC bias voltage, as will be described below.

In an ensuing block 263, a wafer is provided. The wafer can be, for example, a GaAs wafer having a diameter of at least about 6 inches. The wafer can be mounted on any suitable carrier, such as a sapphire carrier having a diameter greater than that of the wafer.

The method 260 continues at a block 264, in which an anode and a cathode are electrically charged to form plasma. For example, a RF power source can be provided between the anode and the cathode in a plasma etcher having a chamber filled with a plasma source gas. The RF power source can excite the plasma source gas and generate plasma. The plasma etcher can include a focus ring, and the cathode can include an electrode shield surrounding the outer circumference of the cathode.

The method 260 continues at a block 266, in which a wafer feature is etched using the focused plasma. The wafer feature can be a relatively large feature, such as a through-wafer via, as was described earlier.

In an ensuing block 268, plasma is passed through the measurement hole. Permitting plasma ions to pass through the measurement hole can permit more accurate electrical measurements near the wafer, such as a more accurate DC bias measurement, which can aid in improving control of the etching rate at the surface of the wafer. For example, etching rate is related to ion energy, which can depend on the electrical potential of the anode relative to the potential near the wafer. Furthermore, using the measurement hole permits measuring the DC bias even in embodiments in which an electrode shield surrounds the cathode.

The method 260 continues at a block 266, in which the DC bias near the wafer or any other suitable electrical parameter indicative of plasma etching rate is measured. The method 260 ends at 279.

Figure 16B:
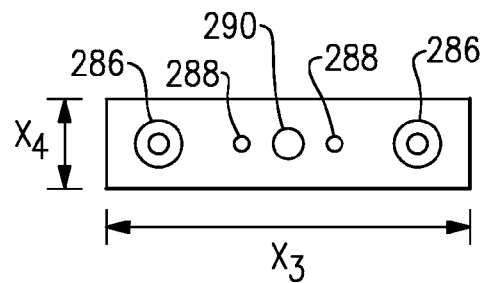
FIG. 16B is an overhead view of the clamp spring body of FIG. 16A.
Figure 16C:
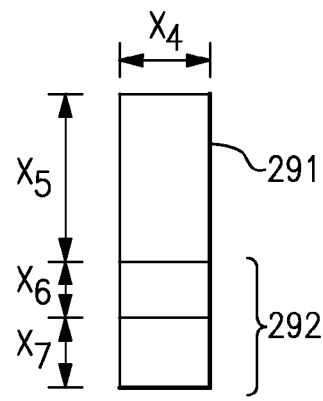
FIG. 16C is a side view of the clamp spring body of FIG. 16A.
Figure 16D:
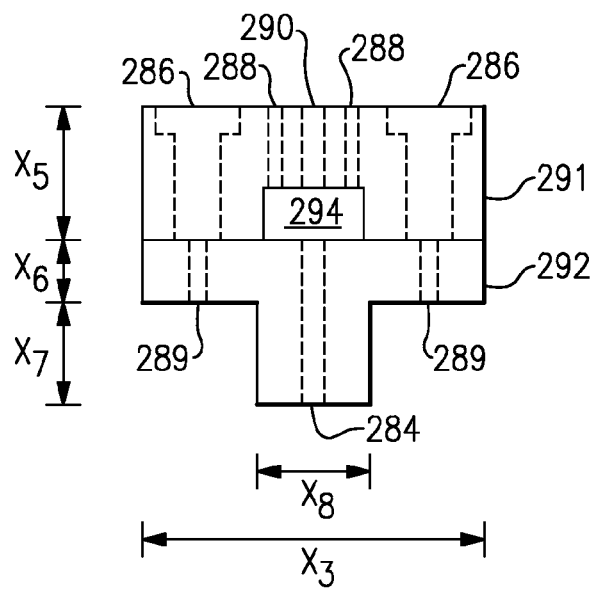
FIG. 16D is a front view of the clamp spring body of FIG. 16A.

FIG. 16A is an exploded perspective view of a spring clamp assembly 280 in accordance with one embodiment. FIGS. 16B, 16C, and 16D are overhead, side and front views, respectively, of the upper and lower spring clamp bodies of FIG. 16A. The spring clamp assembly 280 includes first and second screws 281, springs 282, a third screw 283, an upper spring clamp body 291, and a lower spring clamp body 292. The upper spring clamp body 291 includes springs holes 286, mounting holes 288, and a screw access hole 290. The lower spring clamp body 292 includes assembly holes 289 and a screw hole 284.

The upper spring clamp body 291 includes the spring holes 286 which can receive springs 282 and screws 281. The spring holes 286 can be sized to fit the springs 282 and the screws 281. The springs 281 can pass through the spring holes 286 and can have a diameter selected so as to permit the screws 281 to pass through the center of the springs 281. The screws 281 can have a length greater than the height of the upper spring clamp body 291 so as to permit the screws 281 to reach the assembly holes 289 of the lower spring clamp body 292. Thus, the screws 281 can be used to secure the upper and lower spring clamp bodies 291, 292 together.

The springs 282 can improve operation of a clamp, such as the clamp 250 of FIG. 13, by increasing a tolerance to variation in thickness between samples and/or components of a plasma etcher. For example, the sample can be a thinned wafer mounted on a carrier, and a thickness of the sample can vary from sample to sample. Including springs 282 can aid in providing a tolerance to thickness variation, which can improve clamping. Improving clamping can improve wafer cooling and can protect photoresist and/or other heat-sensitive layers from burning, thereby improving yield.

The upper spring clamp body 291 further includes mounting holes 288 for receiving screws for connecting the spring clamp assembly 280 to a clamp in a plasma etcher. For example, screws can be passed through mounting holes 288 of the spring clamp assembly 280 and can be received into the mounting holes 253 of the clamp 250 of FIG. 2A, thereby connecting the spring clamp assembly 280 to the clamp 250.

The lower spring clamp body 292 includes the screw hole 284 for receiving the third screw 283. The third screw 283 can be used to connect to a rod. For example, a first end of a rod, such as the rod 257 of FIG. 13, can be connected to the spring clamp assembly 280 using the third screw 283 and the screw hole 284. A second end of the rod 257 can be connected to an electrode shield, such as the electrode shield 202 of FIG. 13. The screw access hole 290 of the upper spring clamp body 292 can be used to access the third screw 283 to aid in assembling and disassembling the spring clamp assembly 280.

The upper and lower spring clamp bodies 291, 292 can be formed from any suitable materials. For example, the upper and lower spring clamp bodies 291, 292 can include aluminum.

When viewed from above, the upper spring clamp body 291 can have a width $x_3$ ranging between about 1.2 inches to about 1.8 inches, for example, about 1.5 inches, and a length $x_4$ ranging between about 0.3 inches to about 0.45 inches, for example, about 0.38 inches. The upper body can have any suitable height, including a height $x_5$ ranging between about 0.6 inches to about 0.75 inches, for example, about 0.68 inches. The upper spring clamp body 291 can include a recess positioned below the mounting holes 288 and screw access hole 290 so that a cavity 294 is formed when the upper and lower spring clamp bodies 291, 292 are assembled. The cavity 294 can have a height sized so as to permit a head of the third screw 283 to fit within the cavity 294.

The lower spring clamp body 292 can have a width $x_3$ equal to about that of the upper spring clamp body 291. As illustrated in FIG. 16D, the lower spring clamp body 292 can have a base for passing the screw hole 284 and arms having the assembly holes 289. In one embodiment, height $x_6$ of the arms of the lower spring clamp body 292 is in the range of about 0.1 inches to about 0.25 inches, for example, about 0.17 inches, and the height $x_7$ of the base of the lower spring clamp body 292 is in the range of about 0.35 inches to about 0.5 inches, for example, about 0.42 inches. The width $x_8$ of the base of the lower spring clamp body 292 can be any suitable width, such as a width in the range of about 0.4 inches to about 0.6 inches, for example, about 0.42 inches.

Although one embodiment of the spring clamp assembly 280 has been illustrated in FIGS. 16A-16D, other configurations are possible.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus for etching a plurality of features on a wafer, the apparatus comprising:
    a chamber;
    a feature plate disposed in the chamber for holding the wafer;
    a gas channel configured to receive a plasma source gas;
    an anode disposed above the feature plate;
    a cathode disposed below the feature plate;
    a radio frequency power source configured to provide a radio frequency voltage between the anode and the cathode so as to generate plasma ions in the chamber from the plasma source gas;
    a pump configured to remove gases and etch particulates from the chamber; and
    a clamp configured to clamp the wafer against the feature plate so as to secure the wafer against the feature plate, the clamp including at least one measurement hole for passing a portion of the plasma ions in the chamber to measure a DC bias of the feature plate.

2. The apparatus of claim 1 wherein the plurality of features comprises a plurality of vias.

3. The apparatus of claim 1 wherein the plurality of features comprises a plurality of through-wafer vias.

4. The apparatus of claim 1 wherein the feature plate is configured to hold a wafer bonded to a carrier substrate, the carrier substrate having a diameter greater than that of the wafer.

5. The apparatus of claim 1 wherein the feature plate is configured to hold a wafer having a diameter of at least about 150 mm.

6. The apparatus of claim 1 further comprising a plasma focusing ring positioned between the clamp and the anode.

7. The apparatus of claim 1 further comprising a spring clamp assembly and a rod, the spring clamp assembly having a first end connected to the clamp and a second end connected to a first end of the rod.

8. The apparatus of claim 7 further comprising an electrode shield surrounding the cathode configured to protect the cathode from ions directed toward the cathode.

9. The apparatus of claim 8 wherein the electrode shield includes a hole configured to receive a second end of the rod.

10. The apparatus of claim 7 wherein the spring clamp assembly comprises an upper body and a lower body, the upper body including an assembly hole for receiving both a spring and a screw for attaching the upper body to the lower body.

11. The apparatus of claim 10 wherein the upper body further includes a mounting hole for receiving a screw for attaching the upper body to the clamp.

12. The apparatus of claim 11 wherein the lower body includes a hole for receiving a screw for attaching the lower body to the first end of the rod.

* * * * *